United States Patent
Hébert

(10) Patent No.: US 8,168,486 B2
(45) Date of Patent: May 1, 2012

(54) METHODS FOR MANUFACTURING ENHANCEMENT-MODE HEMTS WITH SELF-ALIGNED FIELD PLATE

(75) Inventor: François Hébert, San Mateo, CA (US)

(73) Assignee: Intersil Americas Inc., Milpitas, CA (US)

( * ) Notice: Subject to any disclaimer, the term of this patent is extended or adjusted under 35 U.S.C. 154(b) by 192 days.

(21) Appl. No.: 12/823,060

(22) Filed: Jun. 24, 2010

(65) Prior Publication Data

US 2010/0330754 A1    Dec. 30, 2010

Related U.S. Application Data

(60) Provisional application No. 61/219,995, filed on Jun. 24, 2009, provisional application No. 61/259,399, filed on Nov. 9, 2009, provisional application No. 61/289,553, filed on Nov. 23, 2009.

(51) Int. Cl.
*H01L 29/778* (2006.01)

(52) U.S. Cl. .. 438/167; 438/172; 257/194; 257/E21.407

(58) Field of Classification Search ............... 438/167, 438/172, FOR. 179; 257/194, E21.407
See application file for complete search history.

(56) References Cited

U.S. PATENT DOCUMENTS

| | | | |
|---|---|---|---|
| 5,097,312 A * | 3/1992 | Bayraktaroglu | 257/197 |
| 5,888,859 A * | 3/1999 | Oku et al. | 438/174 |
| 7,560,325 B1 | 7/2009 | Merrett et al. | |
| 2006/0006414 A1 | 1/2006 | Germain et al. | |
| 2008/0203430 A1 | 8/2008 | Simin et al. | |
| 2008/0238844 A1 | 10/2008 | Kakiuchi et al. | |
| 2009/0236635 A1* | 9/2009 | Wu et al. | 257/194 |
| 2011/0089468 A1* | 4/2011 | Zhang | 257/194 |

OTHER PUBLICATIONS

European Patent Office, "European Search Report", Oct. 26, 2011, Published in: EP.

* cited by examiner

*Primary Examiner* — Thanh V Pham
(74) *Attorney, Agent, or Firm* — Fogg & Powers LLC

(57) ABSTRACT

Various embodiments of the disclosure include the formation of enhancement-mode (e-mode) gate injection high electron mobility transistors (HEMT). Embodiments can include GaN, AlGaN, and InAlN based HEMTs. Embodiments also can include self-aligned P-type gate and field plate structures. The gates can be self-aligned to the source and drain, which can allow for precise control over the gate-source and gate-drain spacing. Additional embodiments include the addition of a GaN cap structure, an AlGaN buffer layer, AlN, recess etching, and/or using a thin oxidized AlN layer. In manufacturing the HEMTs according to present teachings, selective epitaxial growth (SEG) and epitaxial lateral overgrowth (ELO) can both be utilized to form gates.

44 Claims, 20 Drawing Sheets

METHODS FOR MANUFACTURING ENHANCEMENT-MODE HEMTS WITH SELF-ALIGNED FIELD PLATE

CROSS REFERENCE TO RELATED APPLICATION

This application claims the benefit of U.S. Provisional Patent Application Ser. Nos. 61/219,995 filed Jun. 24, 2009; 61/259,399 filed Nov. 9, 2009; and 61/289,553 filed Dec. 23, 2009, all of which are incorporated herein by reference in their entireties.

DESCRIPTION OF EMBODIMENTS

The accompanying drawings, which are incorporated in and constitute a part of this specification, illustrate embodiments of the present teachings and together with the description, serve to explain the principles of the present disclosure.

Figure 1:
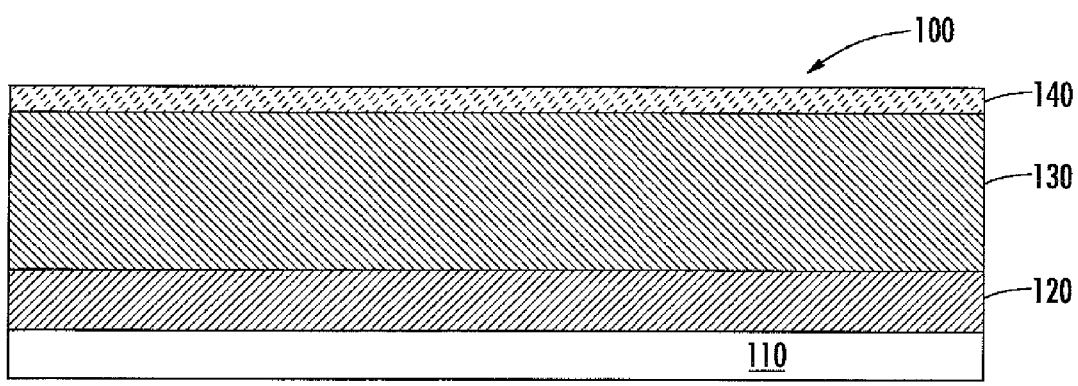
FIGS. 1-13 are cross sections of various manufacturing steps of enhanced mode (e-mode) high electron mobility transistors (HEMTs), according to embodiments of the present teachings.

It should be noted that some details of the FIGS. have been simplified and are drawn to facilitate understanding of the inventive embodiments rather than to maintain strict structural accuracy, detail, and scale. It should also be noted that not all manufacturing steps are illustrated, as the general methods of semiconductor manufacturing are well known.

Reference will now be made in detail to the present embodiments (exemplary embodiments) of the present teachings, examples of which are illustrated in the accompanying drawings. Wherever possible, the same reference numbers will be used throughout the drawings to refer to the same or like parts.

Various embodiments of the disclosure include the formation of enhancement-mode (e-mode) gate injection high electron mobility transistors (HEMT). Embodiments can include compound semiconductor (e.g., GaN, AlGaN, InAlN, InP, InGaAs, InAIAs, etc.) based HEMTs. Embodiments also can include self-aligned P-type gate and field plate structures. The gates can be self-aligned to the source and drain, which can allow for precise control over the gate-source and gate-drain spacing. Additional embodiments include the addition of a GaN cap structure, an AlGaN buffer layer, AlN, recess etching, and/or using a thin oxidized AlN layer (or other insulator). In manufacturing the HEMTs according to present teachings, selective epitaxial growth (SEG) and epitaxial lateral overgrowth (ELO) can both be utilized to form gates.

As used herein, SEG can include using various epitaxial processes, e.g., Metal Organic Chemical Vapor Deposition (MOCVD), molecular beam epitaxy (MBE), etc., to grow an epitaxial layer from a seed point without nucleating additional growth sites. As used herein, ELO can include the growth of an epitaxial layer that grows equally in all directions, i.e., both laterally and vertically. Further, while the following exemplary embodiments discuss specific semiconductor layers, it will be understood that any known compound semiconductor (e.g., III-V, II-VI, etc.) can be used, including binary compound semiconductors, e.g., GaN, AlN, GaAs, InP, InAs, etc., ternary compound semiconductors, e.g., AlGaN, InAlN, AlGaAs, InGaN, InAlAs, InGaAs, etc., and quaternary compound semiconductors, e.g., AlGaInP, etc. It will also be understood that to manufacture the presently taught e-mode HEMTs, these compound semiconductors can be layered and/or stacked in various combinations. As will be understood, the following description of the various processes can include additional steps based on the semiconductor manufacturing process being used. As will also be understood, the parameters of each process step can vary according to the equipment used and the desired layer. As will be understood, P-type devices (N-channel with P-gate) are specifically discussed, however N-type devices can also be used.

In one exemplary process depicted in FIGS. 1-13, a process for forming a GaN/AlGaN e-mode HEMT 100 is shown. In other embodiments, the AlGaN can be replaced by other III-V semiconductors, for example, InAlN to form a GaN/InAlN e-mode HEMT.

In FIG. 1, a substrate 110, for example, Si, Sapphire, Silicon on diamond (SOD), diamond, Silicon Carbide (SiC), etc., is shown over which a buffer layer or layers 120 has been formed. The substrate 110 can have a crystal orientation, e.g., c-axis if Sapphire, or <111> if Si, and the buffer layers 120 can be, for example, GaN/AlN, AlGaN, AlGaN/AlN, etc. The buffer layers 120 can have varying thicknesses of about hundreds to about thousands of angstroms, and can be formed by various well known epitaxial growing techniques. Over the buffer layers 120 a layer of GaN 130 can be grown or in other embodiments the GaN layer 130 can be included as part of the buffer layers 120. The GaN layer 130 can be undoped (intrinsic) or N-type, and have a thickness of about 0.5 microns to greater than about 2 microns depending on the application. For example, low-voltage RF power applications will most likely use a thinner GaN layer than high-voltage power conversion applications. AlGaN 140 can be grown over the GaN layer 130, and can be about 10% to about 28% Al (about 25% preferred) and undoped. The AlGaN layer 140 can have a thickness of about 150 Å to about 300 Å, with about 250 Å preferred (the thickness of the AlGaN layer can impact the channel charge and the pinch-off voltage of depletion mode devices). As will be understood, the above layers can be formed by conventional methods, including epitaxial growth, e.g., MOCVD, molecular beam epitaxy (MBE), etc. Following the growth of the AlGaN layer 140, known techniques for device isolation (e.g., implant and anneal) can be performed.

Figure 2:
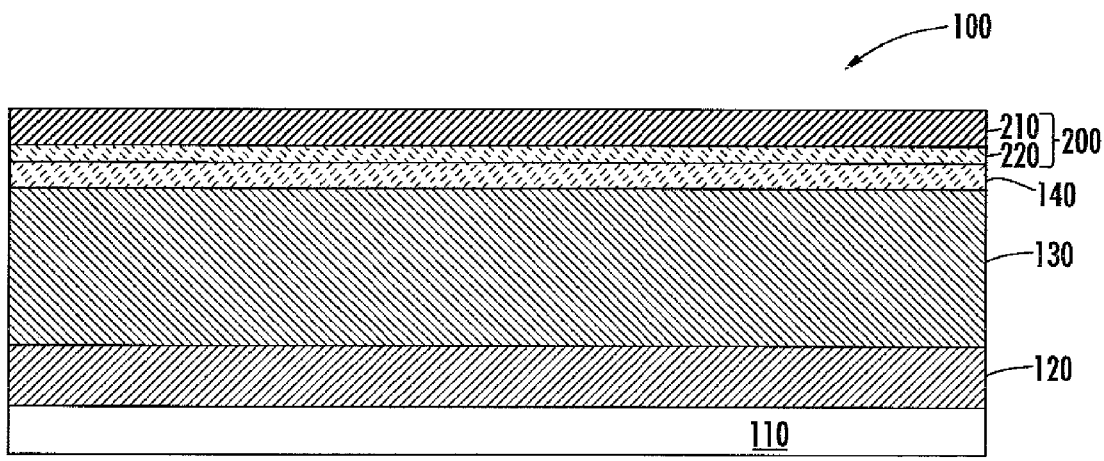
Figure 3:
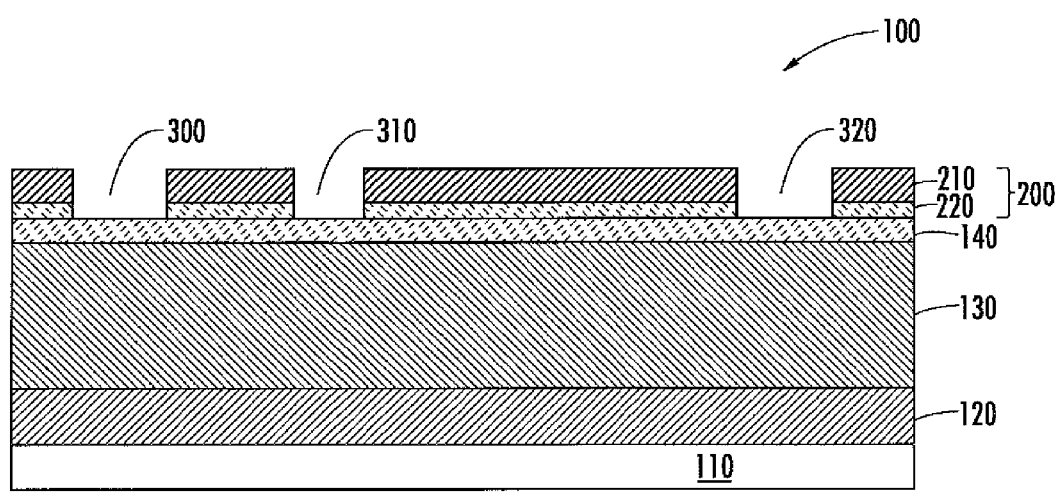

In FIG. 2, a dielectric stack 200 can then be deposited using known oxide and nitride deposition techniques, for example, low pressure chemical vapor deposition (LPCVD), plasma enhanced CVD (PECVD), atmospheric CVD (ACVD), sub-atmospheric CVD (SACVD), atomic layer deposition (ALD), etc. Although oxides and nitrides are specifically mentioned, other materials may be appropriate depending on the application, such as oxy-nitrides, silicon-rich oxides, non-silicon based oxides, etc. The dielectric stack 200 can include one or more dielectric layers, for example, a first dielectric layer 220 including, e.g., nitride, oxide, oxynitride, etc., and a second dielectric layer 210 including an undensified oxide. The dielectric stack 200 can be blanket deposited over the AlGaN layer 140. The dielectric stack 200 can be patterned by, for example, a contact mask (not shown) that can be used to define a source contact area 300, a gate contact area 310, and a drain contact area 320, as shown in FIG. 3. An advantage to this process is that a single masking step is used to self-align the gate contact area to the source contact area 300 and the drain contact area 320. By using a single masking step, precise control of the gate-source and gate-drain spacing can be obtained, which can reduce On-Resistance of the drain to source (Rdson) and breakdown voltage of the drain to source with the gate shorted to the source (BVdss) variations. The resulting structure is shown in FIG. 3, in which the three defined areas (300, 310, 320) can be etched to remove the dielectric stack 200 to expose a surface of the AlGaN layer 140. Etching techniques such as plasma etching, reactive ion etching (RIE), magnetically enhanced RIE (MERIE), inductively coupled plasma (ICP), transformer coupled plasma (TCP), wet etching, chemical mechanical polishing (CMP), etc., can be used. It will be understood the various etching techniques can be used to isotropically and/or anisotropically etch a given material and that the selectivity of a given etch technique can depend on the material being etched and the chemical composition of the etchants.

Figure 4:
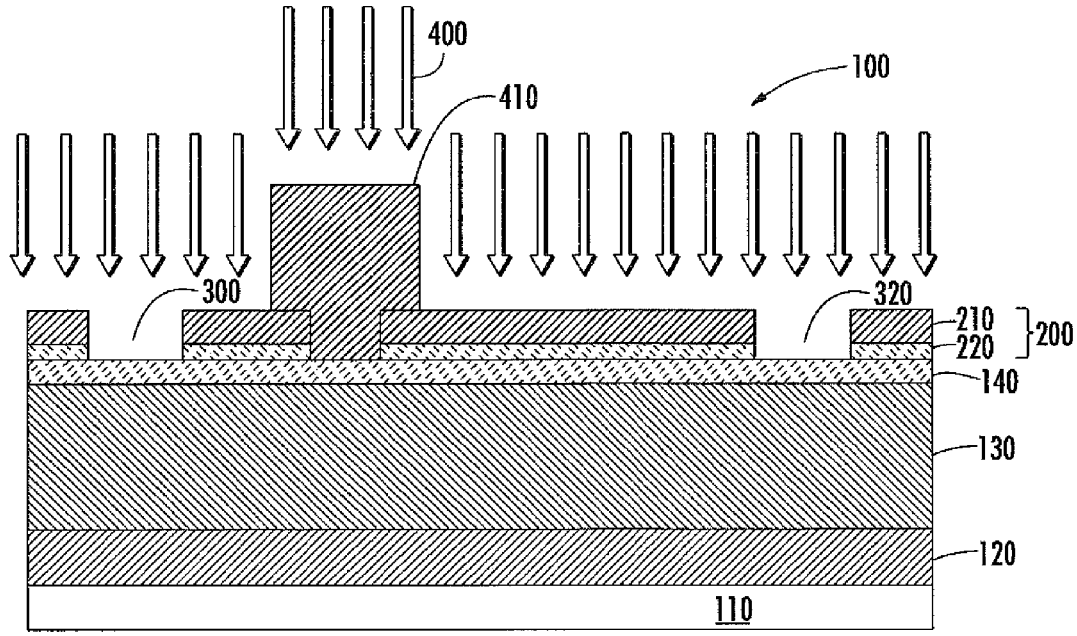
Figure 5:
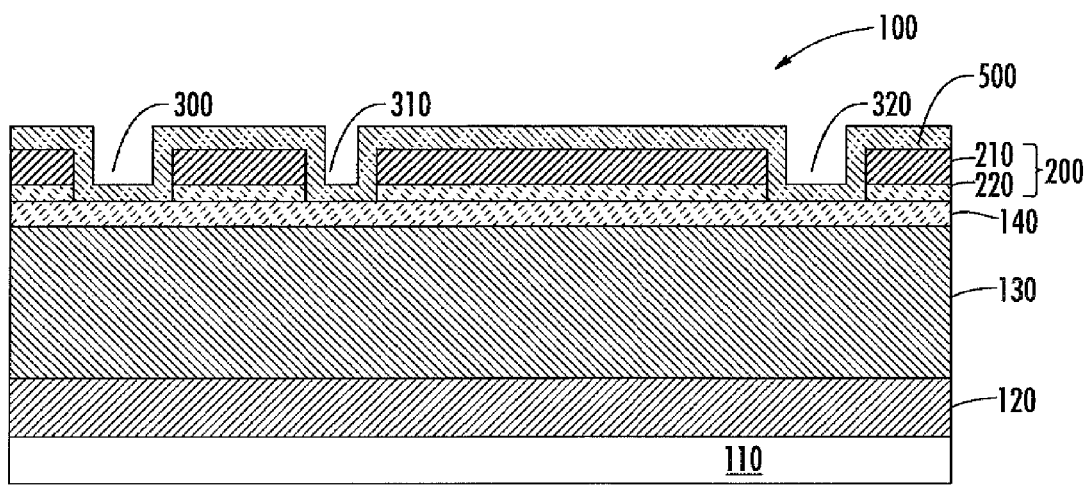
Figure 6:
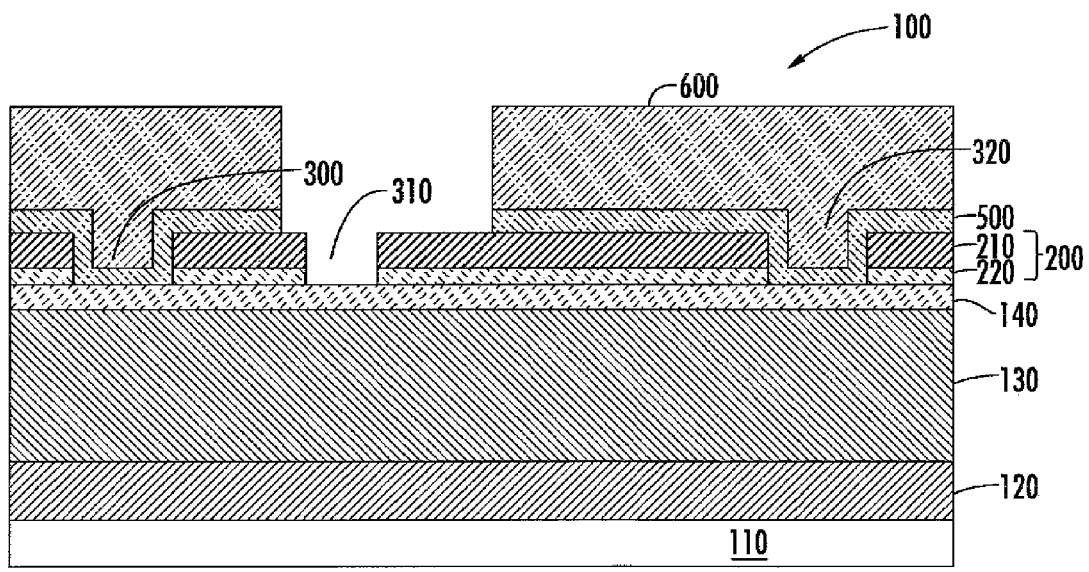
Figure 7:
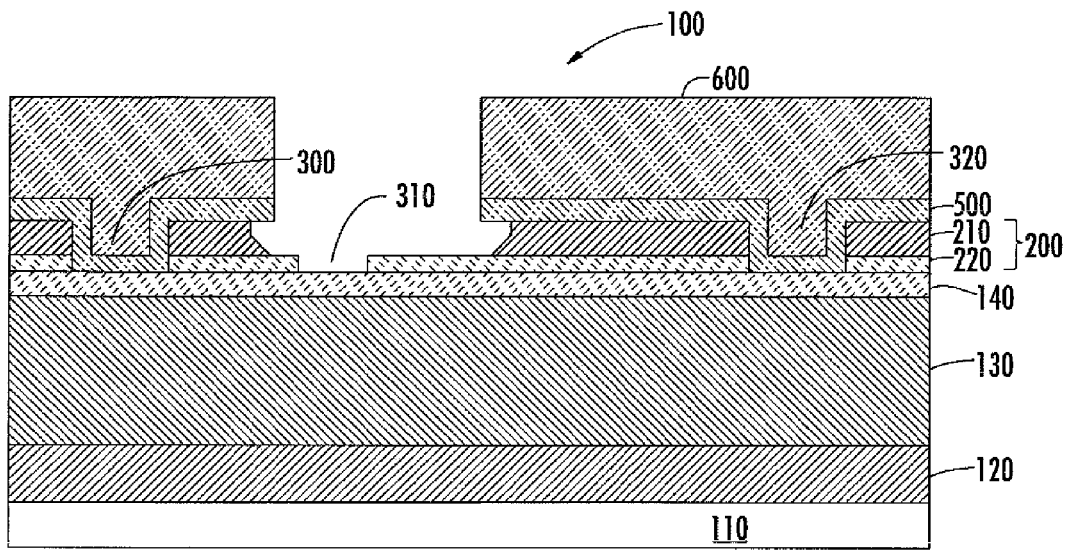

FIG. 4 shows an optional gate protection mask 410 that can be used during an optional N+ implant 400. A resist strip can be performed to remove the gate protection mask 410 after the implant, and an anneal at about 1100° C. to about 1300° C. in nitrogen ambient can be performed to further drive in the N+ implant. In FIG. 5, a dielectric layer 500 (e.g., plasma silicon nitride) can be deposited conformally over the patterned dielectric stack 200 and the exposed portions of the AlGaN layer 140. The nitride can be deposited using LPCVD or PECVD. As shown in FIG. 6, a mask 600 can be formed and used to expose the defined gate contact area 310. A first dry etch (preferably anisotropic) can be used to selectively etch the dielectric layer 500 in the defined gate contact area 310. The first dry etch can be selective to AlGaN and the dielectric stack 200. Following the first dry etch, a second isotropic etch of layer 210, selective to layers 220, the AlGaN layer 140, and the dielectric layer 500 can be performed. The second etch can also etch the dielectric layer 210 at a faster rate to provide under-cutting of dielectric 210 under the dielectric layer 500. Various types of etching can be used, for example, HF, a buffered oxide etchant (BOE) bath, isotropic dry etching using a downstream plasma etch technique, etc. The resulting structure is shown in FIG. 7, which shows the gate contact area 310 including an exposed portion of the AlGaN layer 140 having approximately straight sidewalls formed from the dielectric layer 220 and an approximately wider bowl shaped area formed in the dielectric layer 210, with under-cutting under the dielectric layer 500.

Figure 8:
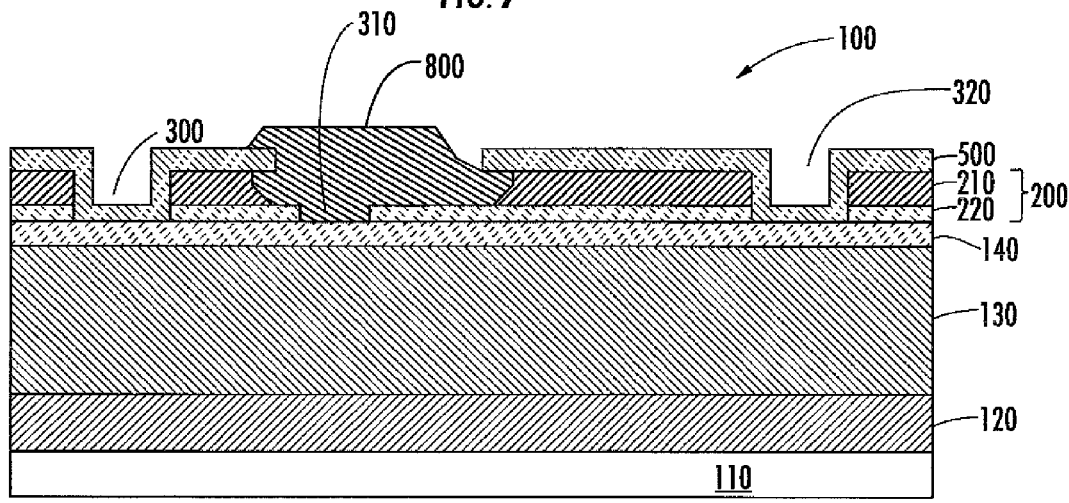
Figure 9:
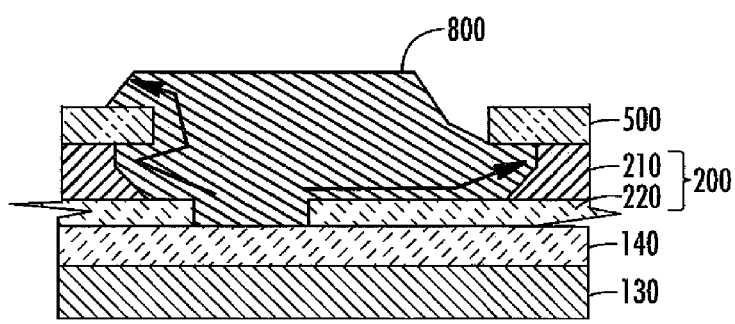

Next, the masking layer 600 can be removed and wafer cleaning can be performed. Following the cleaning, selective epitaxial growth of P-type AlGaN can be performed. As shown in FIGS. 8-9, P-type AlGaN 800 is grown in the gate contact area 310. The epitaxial growth includes lateral overgrowth as shown so that the P-type AlGaN 800 substantially fills the available space formed by the previous etching steps. The P-type AlGaN 800 can be grown from the exposed AlGaN layer 140 (which can be used as a seed region) in gate contact area 310. The P-type AlGaN 800 grows equally vertically and laterally from gate contact area 310, thereby forming/filling the shape left by the previous etches. The epitaxial growth can be performed at temperatures in the range of about 1000° C. to about 1150° C., with NH3, Cp$_2$Mg, TMGa, TMAl, etc. having flow rates adjusted to get growth rates of about 0.5 nm/sec to about 10 nm/sec, and an aluminum concentration of about 10% to about 25%. Other gas sources can also be used.

As will be understood, many different shapes can be formed by the AlGaN 800 depending on the type and length of the previous etching steps and the shape shown in FIGS. 8-9 is not intended to be limiting. In addition, as shown, the P-type AlGaN 800 forms the gate for the e-mode HEMT 100. Also, the portion of the P-type AlGaN gate 800 that is closer to the drain contact area 320 and appears to overhang the dielectric layer 220 can act as a field plate in the finished e-mode HEMT 100. Field plates can reduce peak electric fields around the source and drains of the e-mode HEMT.

Figure 10:
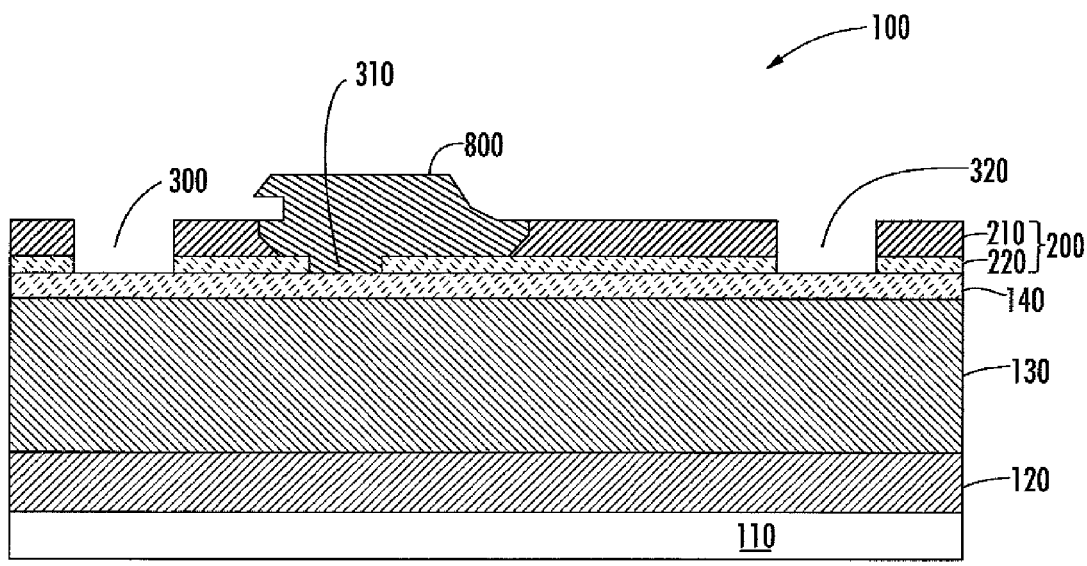
Figure 11:
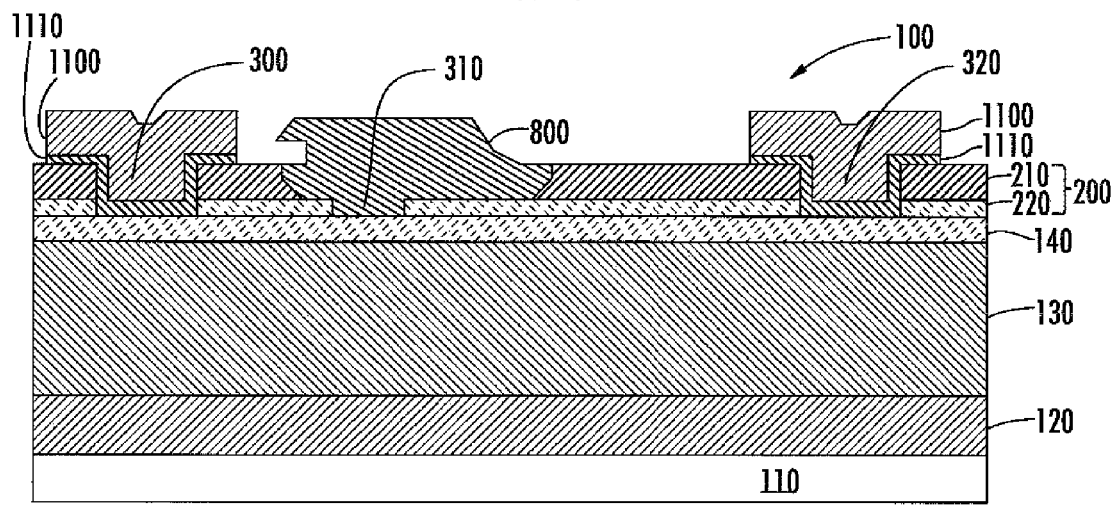
Figure 12:
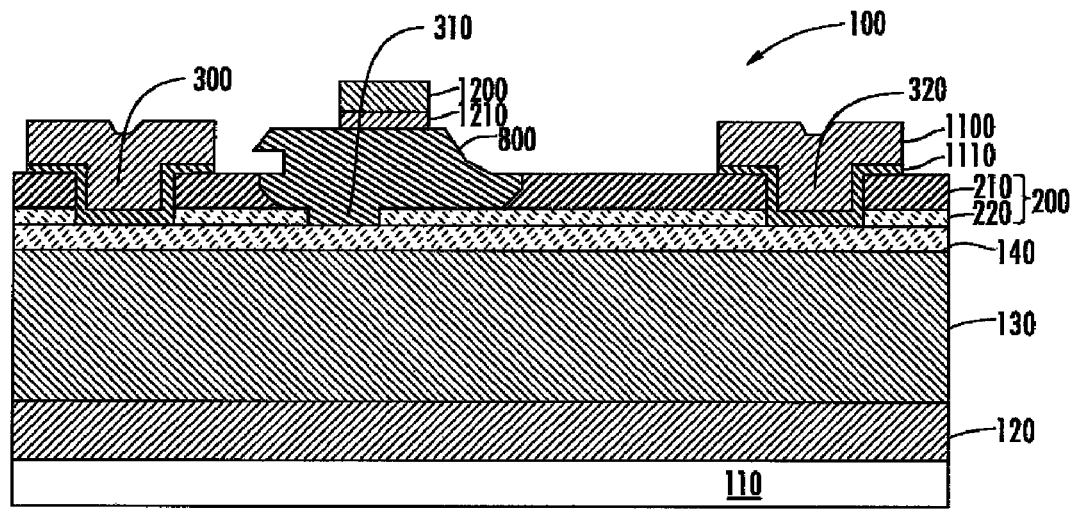

After the P-type AlGaN 800 is grown, the dielectric 500 can be removed by, e.g., isotropic etching, resulting in the structure shown in FIG. 10. As shown in FIG. 11, ohmic metal contacts 1100, 1110 can be formed in the source contact area 300 and in the drain contact area 320. The ohmic metal contacts 1100, 1110 can be formed from various metal layers, for example, Ti/Al/Ni/Au, Ti/Al, etc. In one embodiment for forming the ohmic metal contacts 1100, 1110, a resist mask can be used, a metal stack deposited, the resist mask stripped, and an anneal of the deposited metal stack performed. In an alternative embodiment, a blanket metal deposition can be performed, a metal mask can be used as a guide for a metal etch followed by a resist strip and anneal. Either method can be used to form the ohmic contacts shown in FIG. 11.

Similarly, various methods can be used to deposit the Schottky metal 1200, 1210 over the P-type AlGaN gate 800. In one embodiment, a gate resist mask can be used, followed by Schottky gate metal deposition (e.g., Ni, Au, Pd, etc.), resist strip and an anneal. Alternatively, a blanket gate metal deposition can be performed, then using a gate metal mask and metal etch the gate metal 1200, 1210 can be formed. The gate metal mask can be stripped and the remaining gate metal annealed. In another embodiment, optional blanket dielectric deposition and masking steps can be used prior to the gate metal deposition. The gate metal 1200, 1210 can also form field plates and/or act as double step field plates for the P-type gate 800. The gate metal 1200, 1210 can also be formed in various different shapes to enhance the effect of the field plates.

Figure 13:
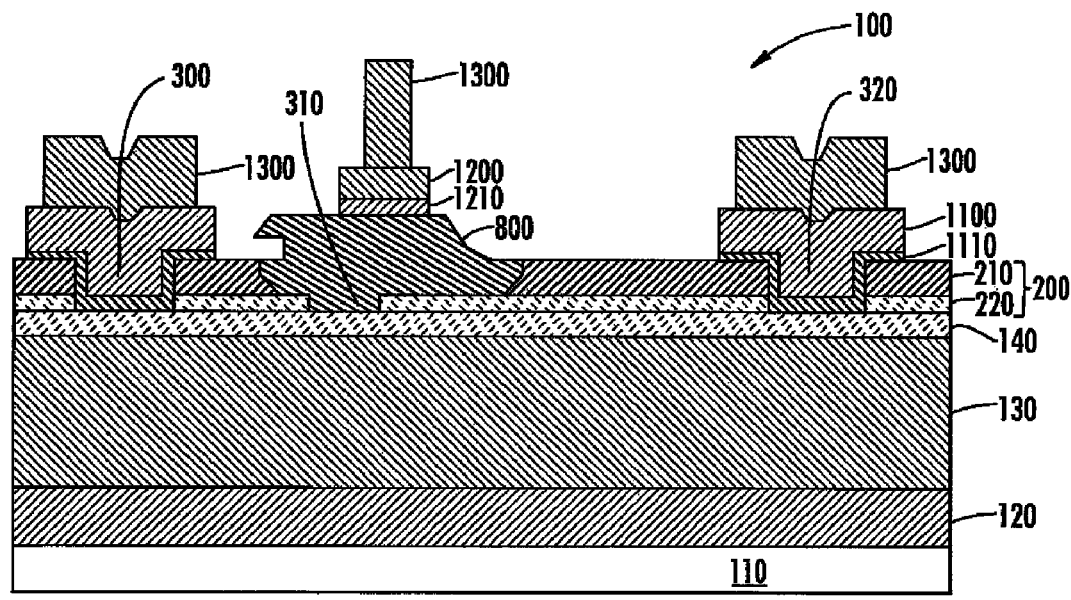

Finally, as shown in FIG. 13, electrode metal 1300 can be deposited and etched (or vice a versa) to form interconnect metal 1300, after optional dielectric isolation between the metal layers (inter metal dielectric, not shown). In embodiments, the interconnect metal 1300 can form an overhang (not shown) from source contact area 300 to gate contact area 310. This overhang area can also act as a field plate (e.g., source connected field plate). Additional steps can include passivation processes, pad masking and etch, top metal interconnection, and final alloying, as are well known in the semiconductor manufacturing art.

As discussed above and will be appreciated, the AlGaN can be replaced by InAlN or various other III-V semiconductors, including binary III-V semiconductors and tertiary III-V semiconductors, for example, presently taught embodiments can include GaN/InAlN/P-type InAlN HEMTs.

Figure 14:
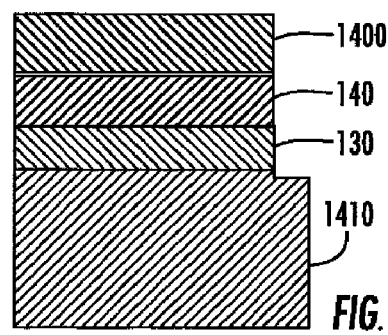
FIG. 14 is a cross section of a cap structure that can be used in the manufacturing of the e-mode HEMTs, according to embodiments of the present teachings.

FIG. 14 shows a focused view of the cap layer 1400 and the heterostructure. FIGS. 15-23 show another presently taught embodiment of an e-mode HEMT 1500 including a GaN cap layer 1400 over the AlGaN/GaN heterostructure discussed with reference to FIGS. 1-13. Also included is an AlGaN layer 1410 between the buffer layers 120 and the GaN layer 130, which as discussed above, can be part of the buffer layers 120.

Figure 15:
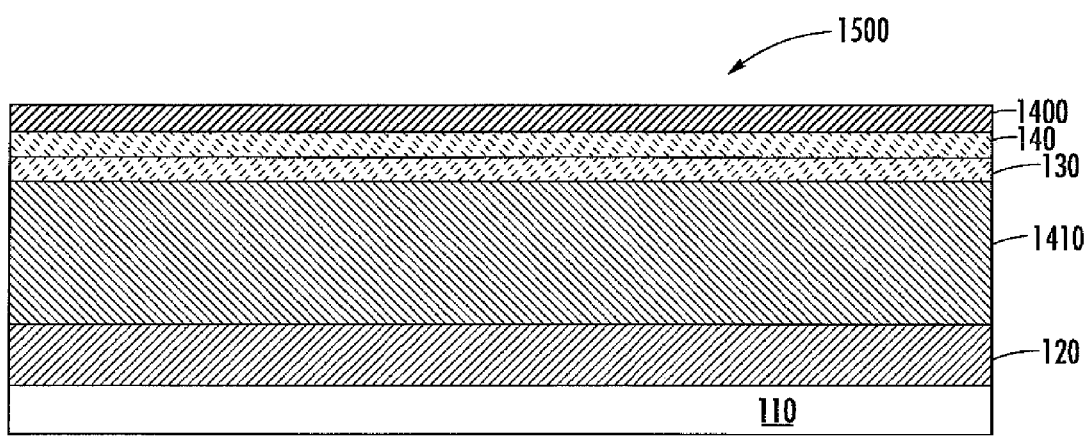
FIGS. 15-23 are cross sections of various manufacturing steps of e-mode HEMTs including the cap structure of FIG. 14, according to embodiments of the present teachings.
Figure 16:
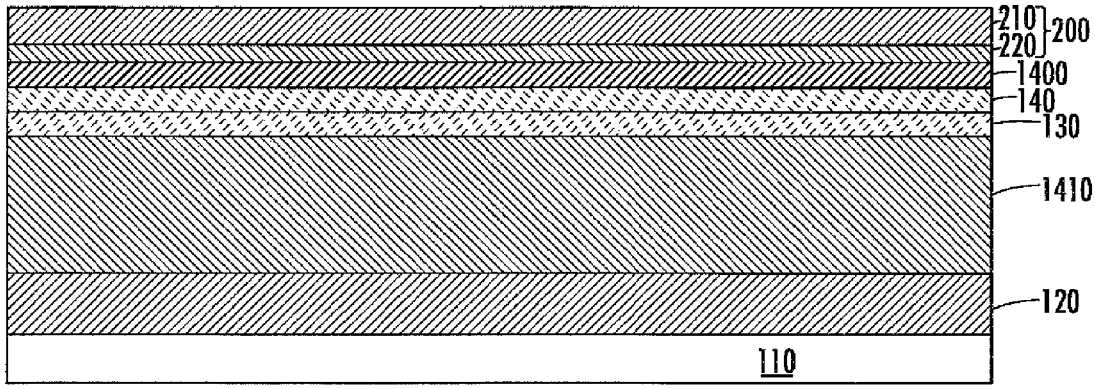

FIG. 14 shows the double two dimensional electron gas (2DEG) structure including an AlGaN layer 1410, a GaN layer 130, an AlGaN layer 140, and a cap layer of GaN layer 1400. The AlGaN layer 1410 can have a low Al content of about 1% to about 6%. The AlGaN layer 140 can have about 20% to about 27% Al. As shown in FIG. 15, this structure can be formed over buffer layers 120, which can be formed over substrate 110 as discussed above. Similar to the method discussed above, the various semiconductor layers (1410, 130, 140, and 1400) can be grown as epitaxial layers using, e.g., MOCVD, MBE, etc.

Figure 17:
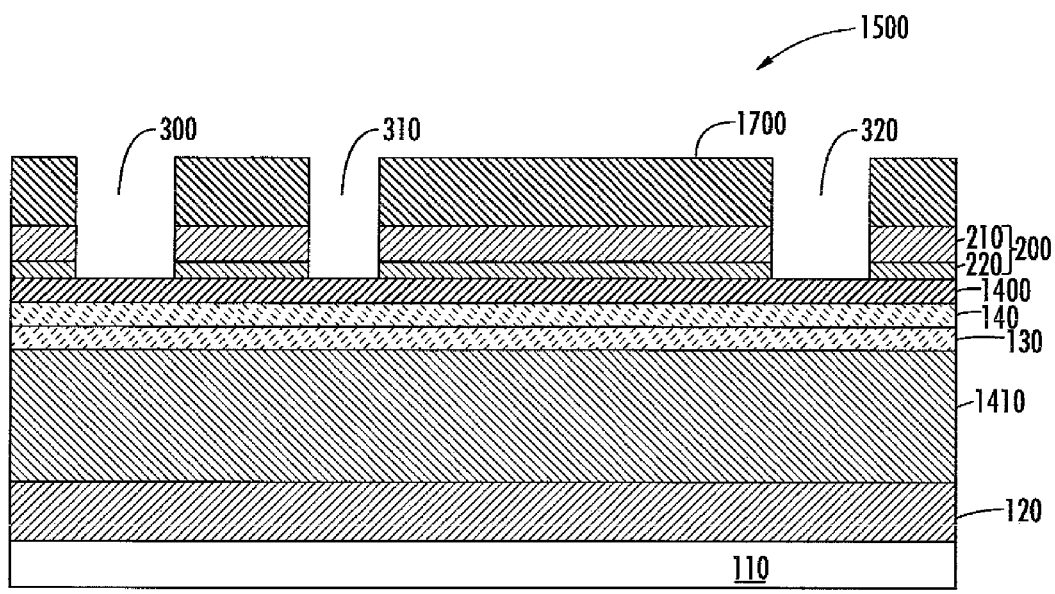
Figure 18:
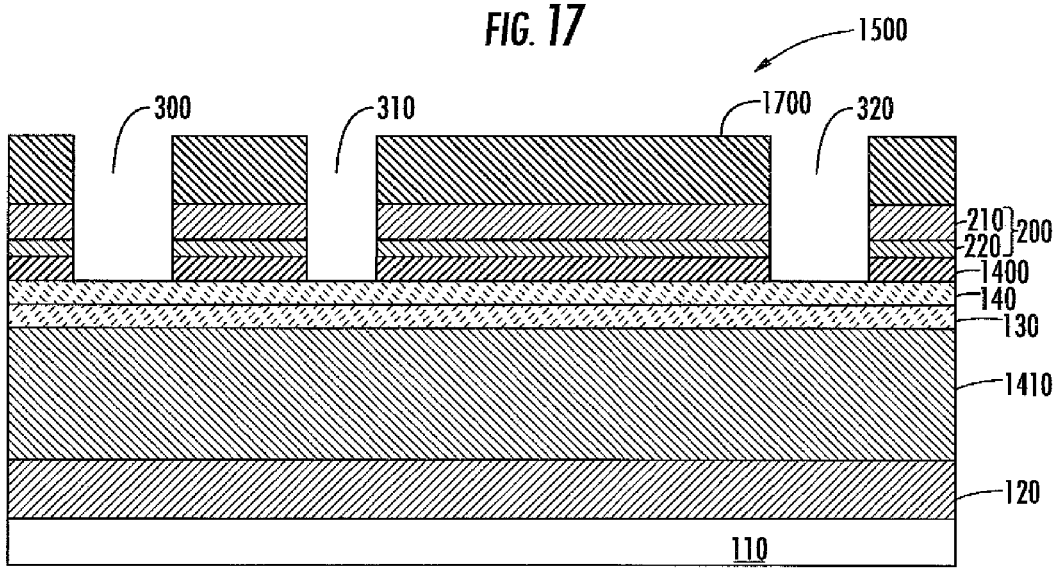

Following the growth of the double 2DEG structure, dielectric stack 200 can be formed by deposition. As discussed above, dielectric stack 200 can include one or more dielectric layers, for example, a first dielectric layer 220 including, e.g., nitride, oxide, oxynitride, etc., and a second dielectric layer 210 including an undensified oxide. The dielectric stack 200 can be blanket deposited over the GaN layer 1400. As shown in FIG. 17, the dielectric stack 200 can be patterned by, for example, a contact mask 1700, that defines a source contact area 300, a gate contact area 310, and a drain contact area 320. An advantage to this process is that a single masking step is used to self-align the gate contact area to the source contact area 300 and the drain contact area 320. The three defined areas can be etched to remove the dielectric stack 200 to expose a surface of the GaN layer 1400. Etching techniques such as plasma etching, reactive ion etching (RIE), magnetically enhanced RIE (MERIE), inductively coupled plasma (ICP), transformer coupled plasma (TCP), wet etching, chemical mechanical polishing (CMP), etc., can be used.

Following the dielectric stack 200 etch, the same contact mask 1700 can be used to further etch the GaN layer 1400 to expose the AlGaN layer 140 in the source contact area 300, the gate contact area 310, and the drain contact area 320. The GaN layer 1400 etch can be an anisotropic dry etch using inductively coupled plasma (ICP) or other dry etch technique, and/or various photo-enhanced etching techniques, e.g., photochemical wet etch, that are selective to the AlGaN layer 140 and to the dielectric stack 200.

Figure 19:
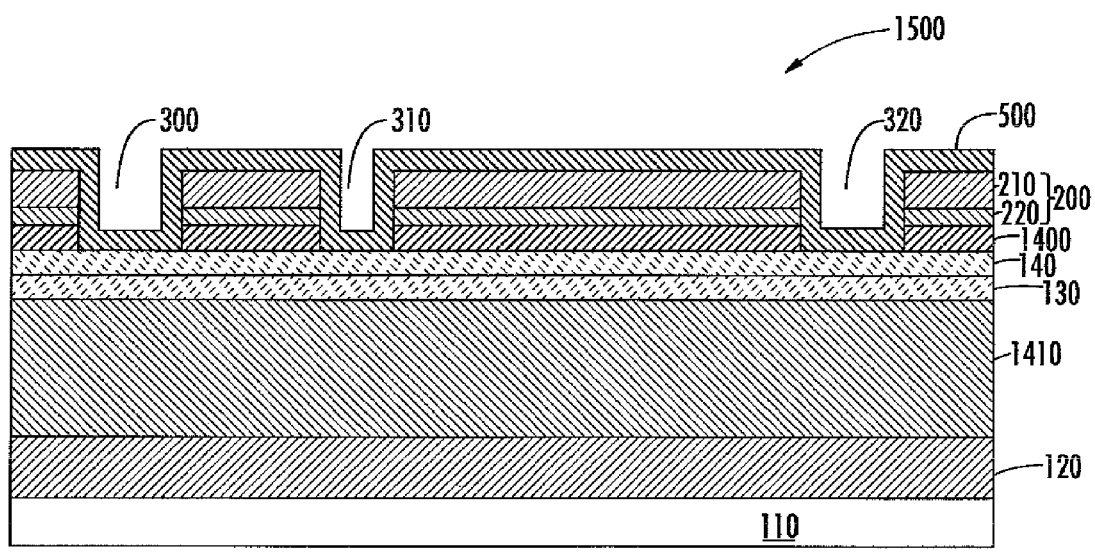
Figure 20:
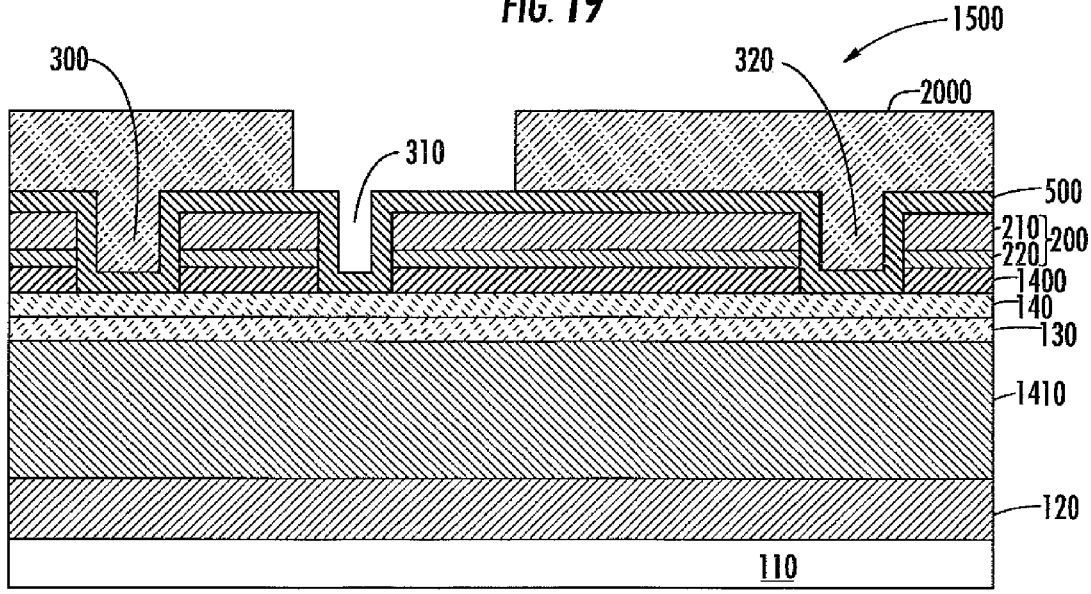
Figure 21:
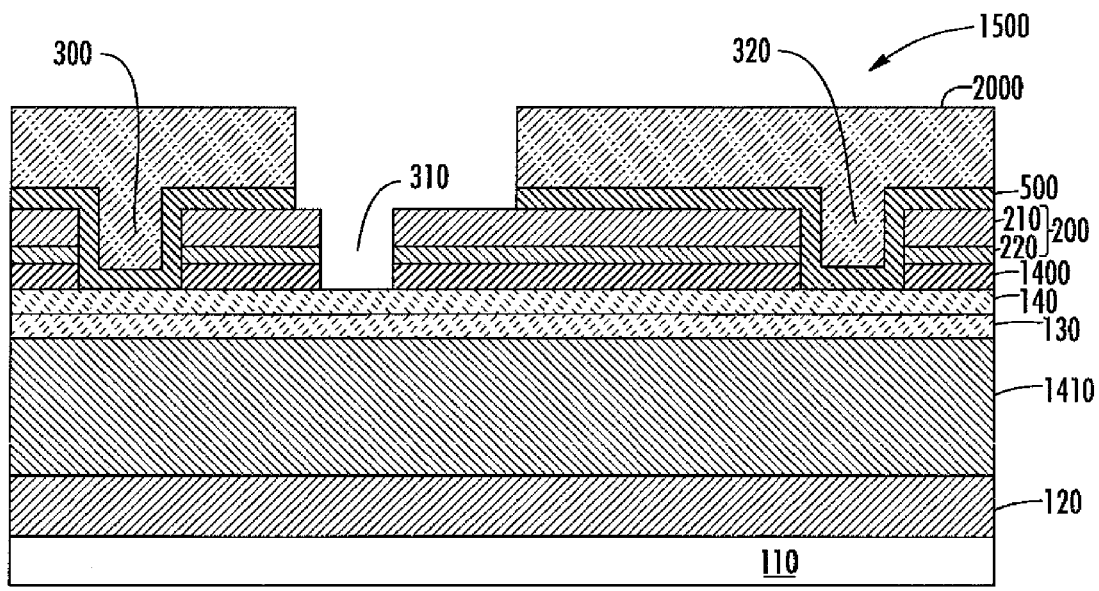
Figure 22:
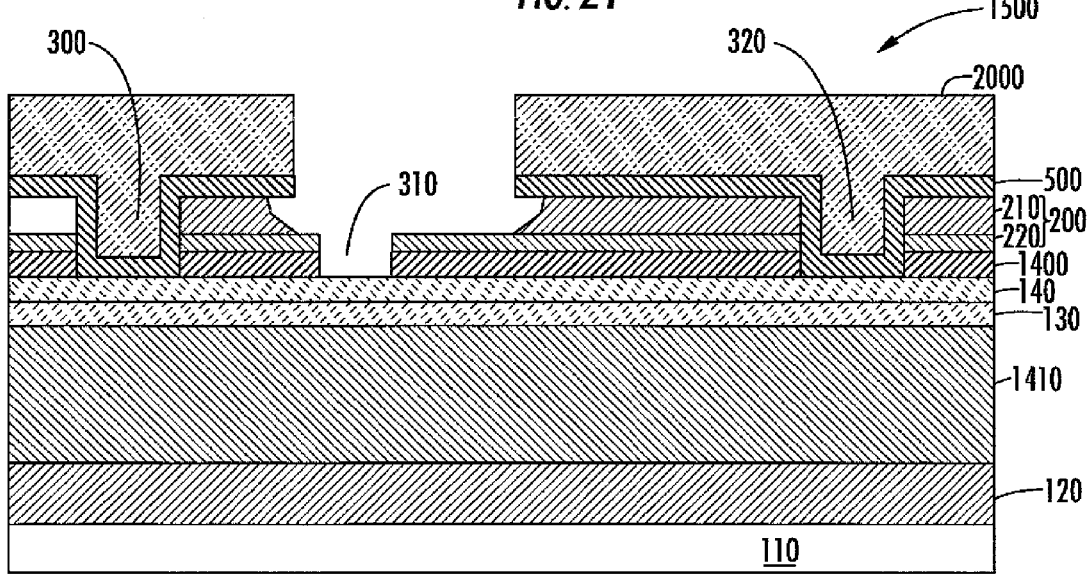

In FIG. 19, a dielectric layer 500 (e.g., plasma silicon nitride) can be deposited conformally over the patterned dielectric stack 200 and the exposed portions of the AlGaN layer 140. The nitride can be deposited using LPCVD or PECVD. As shown in FIG. 20, a mask 2000 can be formed to expose the defined gate contact area 310. A first dry etch (preferably anisotropic, but some lateral etching can also be acceptable) can be used to selectively etch the dielectric layer 500 in the defined gate contact area 310. The first dry etch can be selective to AlGaN, GaN layer 1400, and the dielectric stack 200. Following the first dry etch, a second etch that is selective to dielectric layer 220, GaN layer 1400, AlGaN layer 140, and the dielectric layer 500 can be performed. Various types of isotropic etching can be used, for example, HF, buffered oxide etchant (BOE) bath, isotropic dry etching using a downstream plasma etch technique, etc. The resulting structure is shown in FIG. 22, which shows the gate contact area 310 including an exposed portion of the AlGaN layer 140 having approximately straight sidewalls formed from the GaN layer 1400 and dielectric layer 220, and an approximately wider bowl shaped area formed in the dielectric layer 210, with under-cutting under the dielectric layer 500.

Figure 23:
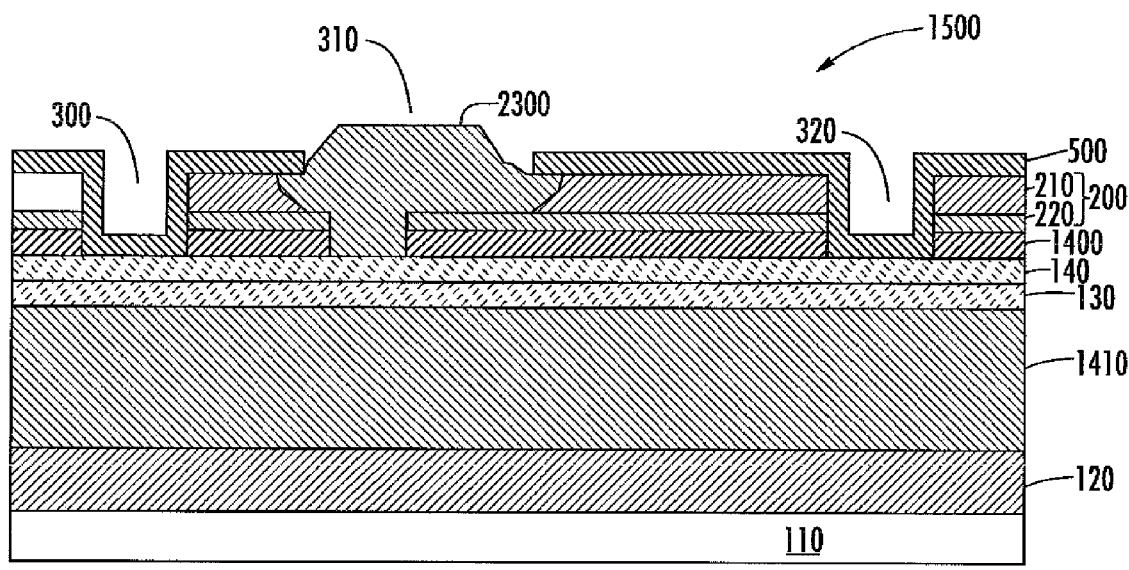

Next, the masking layer 2000 can be removed and a wafer cleaning can be performed. Following the cleaning, GaN selective epitaxial growth of P-type AlGaN can be performed. As shown in FIG. 23, P-type AlGaN 800 can be grown in the gate contact area 310. The epitaxial growth includes lateral overgrowth as shown so that the P-type AlGaN 800 substantially fills the available space formed by the previous etching steps. The P-type AlGaN 800 can be grown from the exposed AlGaN layer 140 (which can be used as a seed region) in gate contact area 310. The P-type AlGaN 800 grows equally vertically and laterally from gate contact area 310, thereby forming/filling the shape left by the previous etches. The e-mode HEMT 1500 can be further processed as discussed above, including but not limited to, electrode formation, passivation, pad formation, etc.

FIGS. 24-32 show another embodiment of an e-mode HEMT 2400 including an AlN semiconductor layer 2410. The e-mode HEMT 2400 is manufactured by similar processes as those discussed above.

Figure 24:
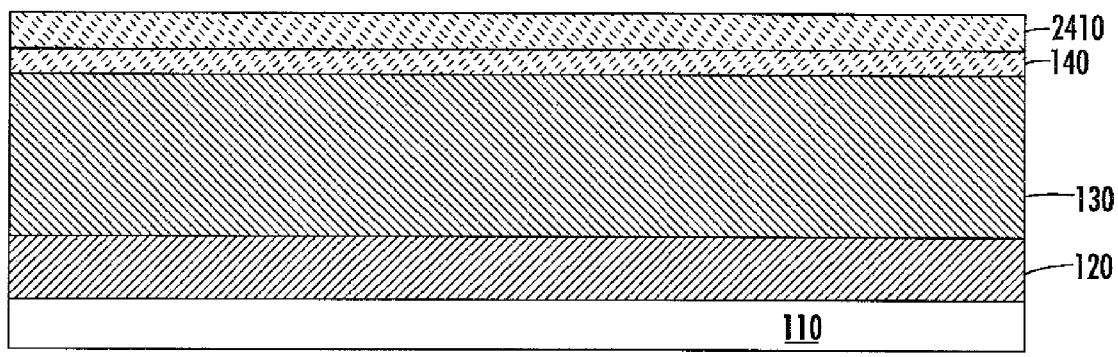
FIGS. 24-41 are cross sections of various manufacturing steps of e-mode HEMTs including AlN, according to embodiments of the present teachings.

In FIG. 24, a substrate 110, for example, Si, Sapphire, Silicon on diamond (SOD), diamond, SiC, etc., is shown over which a buffer layer or layers 120 can be formed. The substrate 110 can have a crystal orientation, e.g., c-axis if Sapphire, <111> if Si. The buffer layers 120 can be, for example, GaN/AlN, AlGaN, AlGaN/AlN, etc. Over the buffer layers 120 a layer of GaN 130 is shown. The GaN layer 130 can be undoped. AlGaN 140 can be formed over the GaN layer 130, which can be about 10% to about 28% Al and undoped. Over the AlGaN layer 140, an AlN layer 2410 can be formed. The AlN layer 2410 can be grown in-situ to control quality and the crystal interface. A surface pre-treatment prior to the in-situ AlN deposition can also be performed in order to obtain an AlN layer with the appropriate structure. The pre-treatment can include nitridation of the exposed surface (e.g., by exposing the surface to ammonia at elevated temperatures, e.g., greater than about 500° C.). The AlN layer 2410 can also protect the device layers. Following the growth of the AlGaN layer 140, known techniques for device isolation (e.g., implant and anneal) can be performed.

Figure 25:
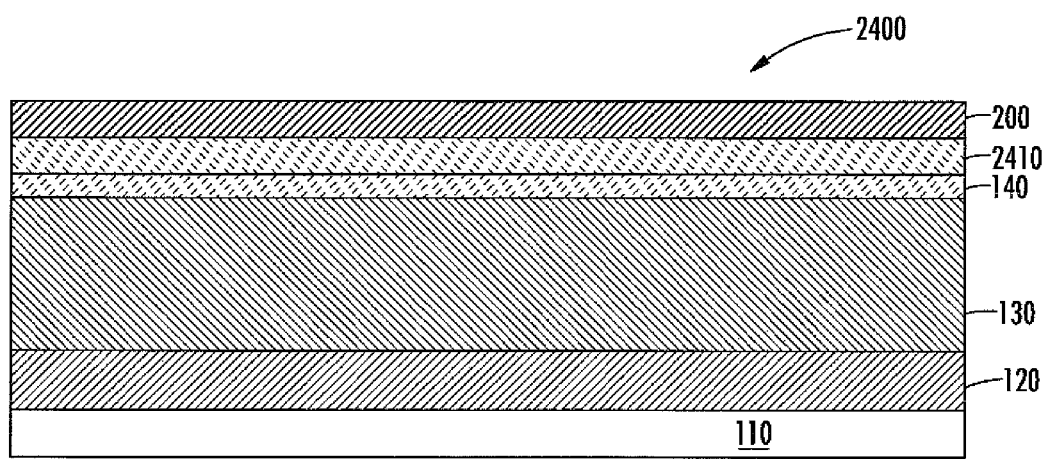
Figure 26:
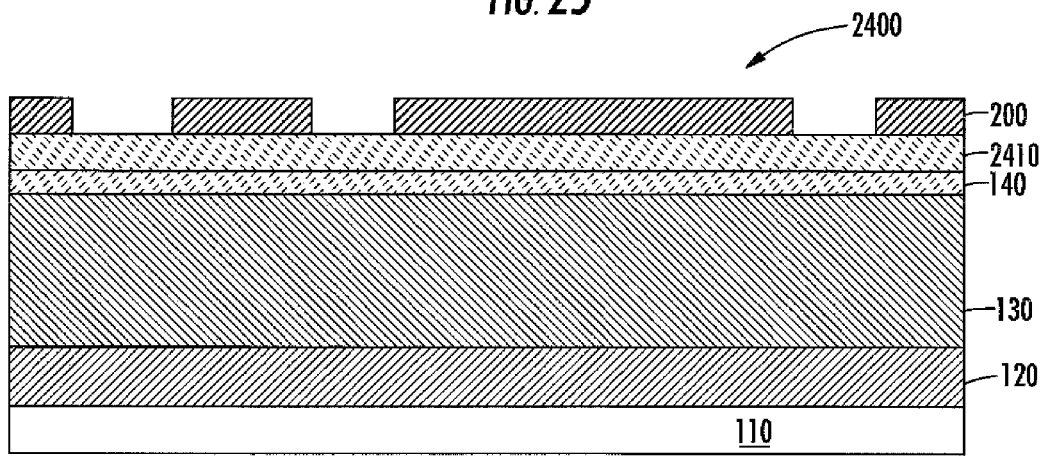

FIG. 25 shows a dielectric stack 200 deposited over the AlN layer 2410. The dielectric stack 200 can be one or more dielectric layers. In the embodiment shown, a single layer undensified oxide is used. The dielectric stack 200 can be blanket deposited over the AlN layer 2410. As shown in FIG. 26, the dielectric stack 200 can be patterned by, for example, a contact mask (not shown), that can be used to define a source contact area 300, a gate contact area 310, and a drain contact area 320. An advantage to this process is that a single masking step is used to self-align the gate contact area to the source contact area 300 and the drain contact area 320. The resulting structure is shown in FIG. 26, in which the three defined areas can be etched to remove the dielectric stack 200 to expose a surface of the AlN layer 2410.

Figure 27:
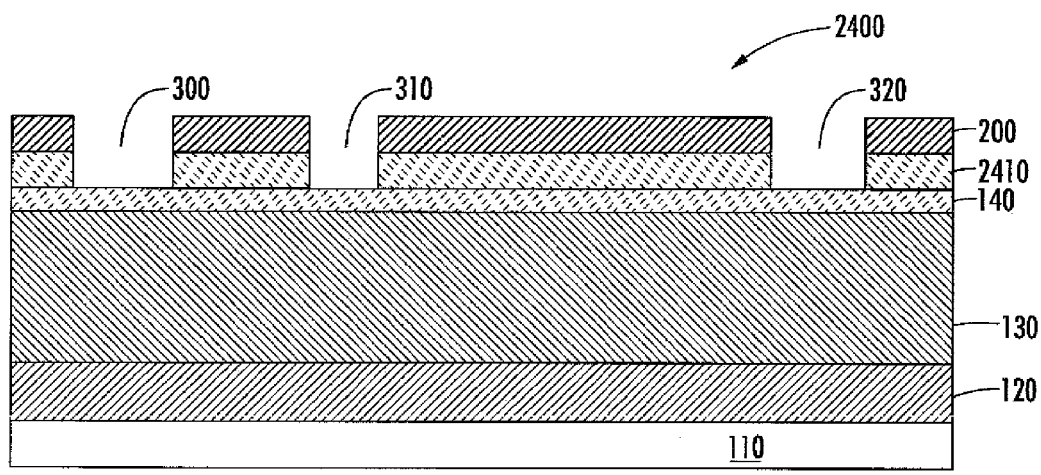

In FIG. 27, the etched dielectric stack 200 is used as a masking layer for etching the AlN layer 2410 in the source contact area, the gate contact area, and the drain contact area to expose the AlGaN layer 140. The AlN layer 2410 etch can be a selective etch to AlGaN layer 140 and to dielectric stack 200. Potassium hydroxide (KOH) and similar etchants can be used for this step, such as, ICP dry etch, or photo enhanced chemical etching techniques.

Figure 28:
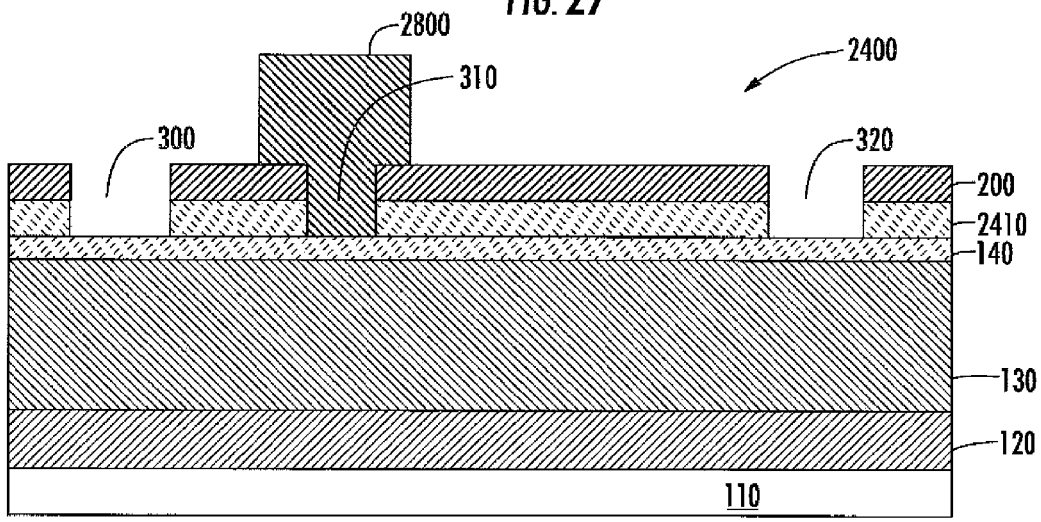
Figure 29:
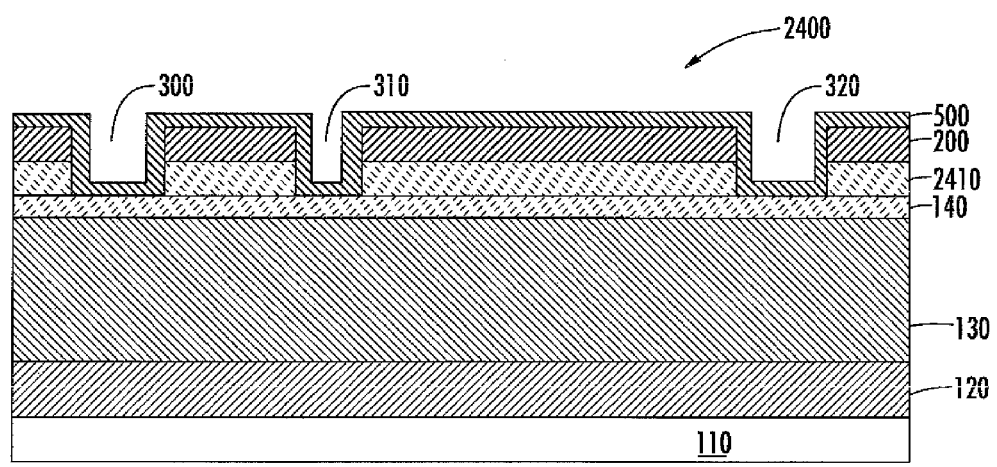
Figure 30:
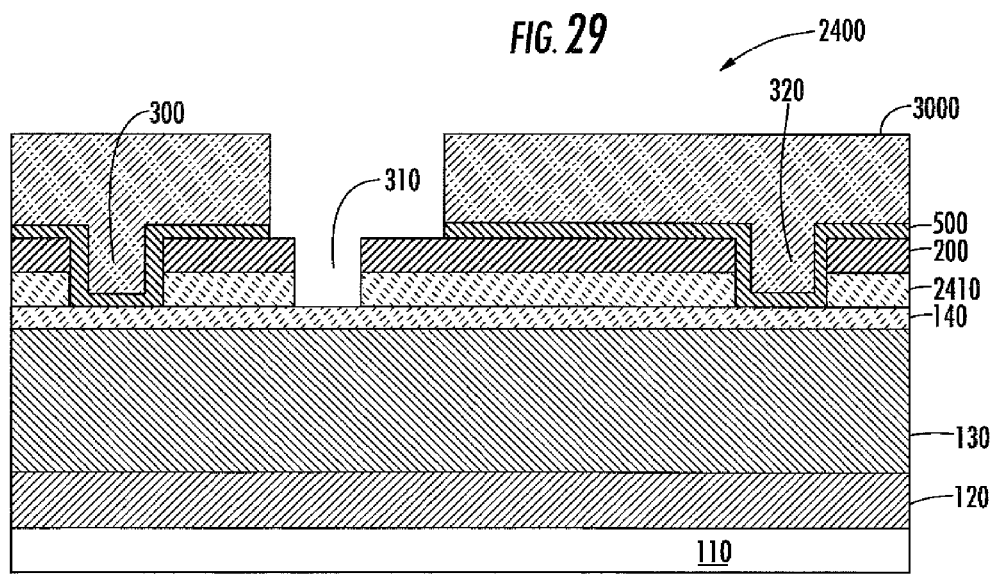
Figure 31:
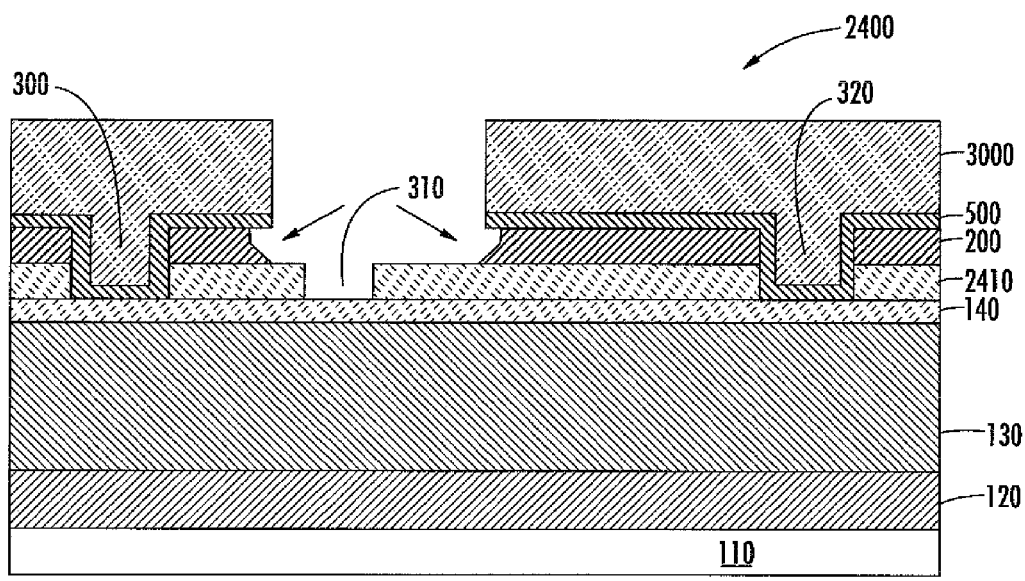

FIG. 28 shows an optional gate protection mask 2800, which an optional N+ implant (not shown) process can use to protect the gate contact area 310. A resist strip can be performed to remove the gate protection mask 2800 and an anneal at about 1100° C. to about 1300° C. in nitrogen ambient can be performed to further drive in the N+ implant. In FIG. 29, a dielectric 500 (e.g., plasma silicon nitride) can be deposited conformally over the patterned dielectric stack 200 and the exposed portions of the AlGaN layer 140. The nitride can be deposited using LPCVD. As shown in FIG. 30, a resist mask 3000 can be used to expose the defined gate contact area 310 for further etch. A first dry etch can be used to selectively etch the dielectric layer 500 in the defined gate contact area 310. The first dry etch can be selective to AlGaN, AlN, and the dielectric stack 200. Following the first dry etch, a second etch that is selective to the dielectric layer 500, the AlN layer 2410, and the AlGaN layer 140 can be performed. The resulting structure is shown in FIG. 31, which shows the gate contact area 310 including an exposed portion of the AlGaN layer 140 having approximately straight sidewalls formed from the AlN layer 2410 and an approximately wider bowl shaped area formed in the dielectric stack 200, with undercutting under the dielectric layer 500.

Figure 32:
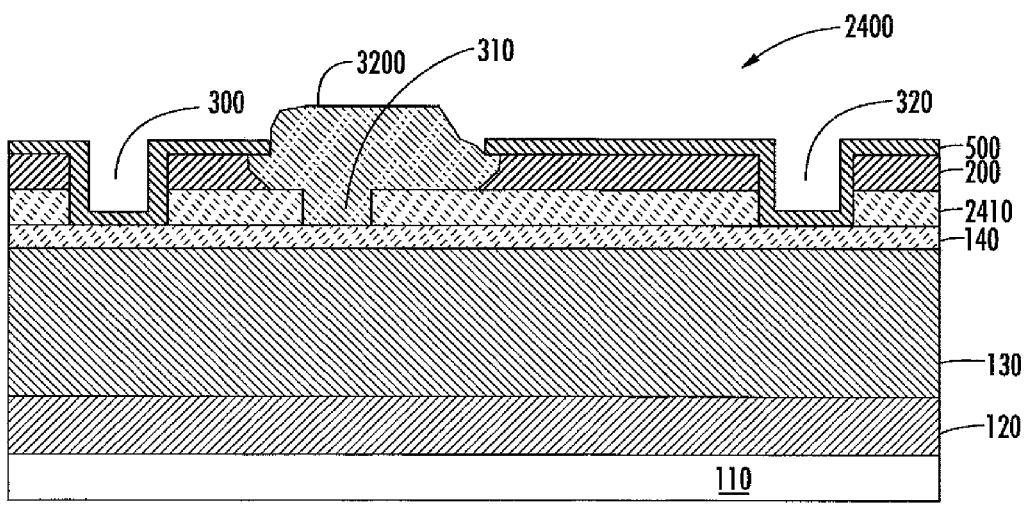

Next, the masking layer 3000 can be removed and a wafer cleaning can be performed. Following the cleaning, selective epitaxial growth of P-type AlGaN can be performed. As shown in FIG. 32, P-type AlGaN 3200 can be grown in the gate contact area 310. The epitaxial growth can include lateral overgrowth as shown so that the P-type AlGaN 3200 substantially fills the available space formed by the previous etching steps. The P-type AlGaN 3200 can be grown from the exposed AlGaN layer 140 (which can be used as a seed region) in gate contact area 310. The P-type AlGaN 3200 can grow equally vertically and laterally from gate contact area 310, thereby forming/filling the shape left by the previous etches.

As will be understood, many different shapes can be formed by the AlGaN 3200 depending on the type and length of the previous etching steps and the shape shown in FIG. 32 is not intended to be limiting. In addition, as shown, the P-type AlGaN 3200 forms the gate for the e-mode HEMT 2400. Also, the portion of the P-type AlGaN gate 3200 that is closer to the drain contact area 320 and appears to overhang the dielectric stack 200 can act as a field plate in the finished e-mode HEMT 2400. Field plates can reduce peak electric fields around the source and drains of the e-mode HEMT.

While the following steps are not illustrated, they are similar to the steps described above with reference to FIGS. 10-13. After the P-type AlGaN 3200 is grown, the dielectric 500 can be removed by, e.g., isotropic etching. Next, ohmic metal contacts can be formed in the source contact area 300 and in the drain contact area 320. The ohmic metal contacts can be formed from various metal layers, for example, Ti/Al/Ni/Au, Ti/Al, etc. In one embodiment for forming the ohmic metal contacts, a resist mask can be used, a metal stack deposited, the resist mask stripped, and an anneal of the deposited metal stack performed. In an alternative embodiment, a blanket metal deposition can be performed, a metal mask can be used as a guide for a metal etch followed by a resist strip and anneal. Either method can be used to form the ohmic contacts.

Similarly, various methods can be used to deposit Schottky gate metal over the P-type AlGaN gate 3200. In one embodiment, a gate resist mask can be used, followed by gate metal deposition (e.g., Ni, Au, Pd, etc.), resist strip and an anneal. Alternatively, a blanket gate metal deposition can be performed, then using a gate metal mask and metal etch the gate metal can be patterned. The gate metal mask can be stripped and the remaining Schottky metal annealed. In another embodiment, optional blanket dielectric deposition and masking steps can be used prior to the Schottky gate metal deposition. The gate metal can also form field plates and/or act as a double step field plates for P-type gate 3200. The gate metal can also be formed in various different shapes to enhance the effect of the field plates.

Finally, electrode metal can be deposited and etched (or vice a versa) to form interconnect metal. In embodiments, the interconnect metal can form an overhang from source contact area 300 to gate contact area 310. This overhang area can also act as a field plate. Additional steps can include passivation processes, pad masking and etch, top metal interconnection, and final alloying, as are well known in the semiconductor manufacturing art.

Figure 33:
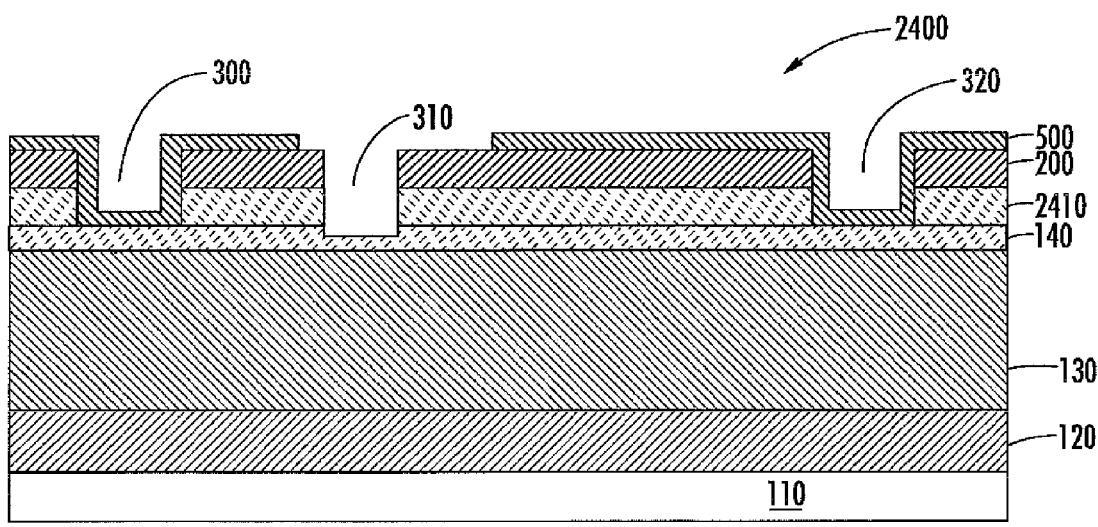
Figure 34:
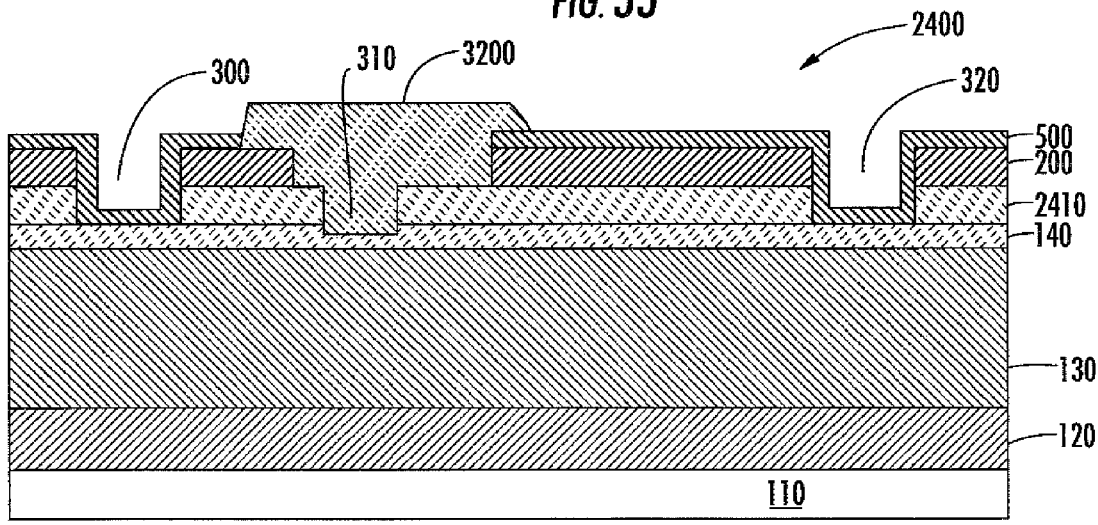

In alternative embodiments of the e-mode HEMT 2400, following the AlN layer 2410 etch, a recess can be etched into the AlGaN to form a recessed P-gate structure as shown in FIG. 33. This recess etch can be performed to a depth of typically a fraction of the AlGaN thickness (about 5% to about 75%), depending on the device characteristics desired for the application, and can also be performed in the above discussed processes. Additional recess etches can also be performed in the source contact area and the drain contact area. FIG. 34 shows the resulting AlGaN P-gate 3200 structure.

Figure 35:
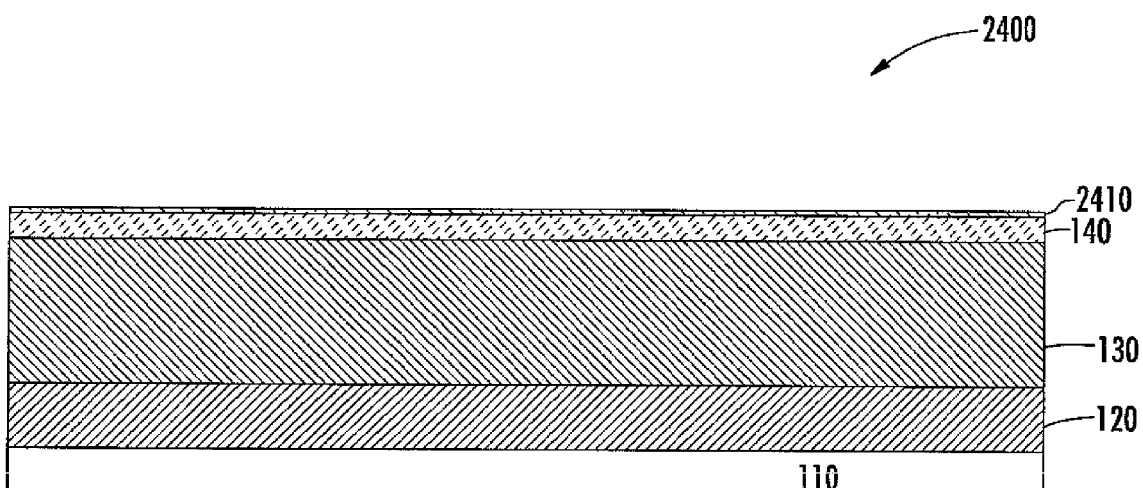
Figure 36:
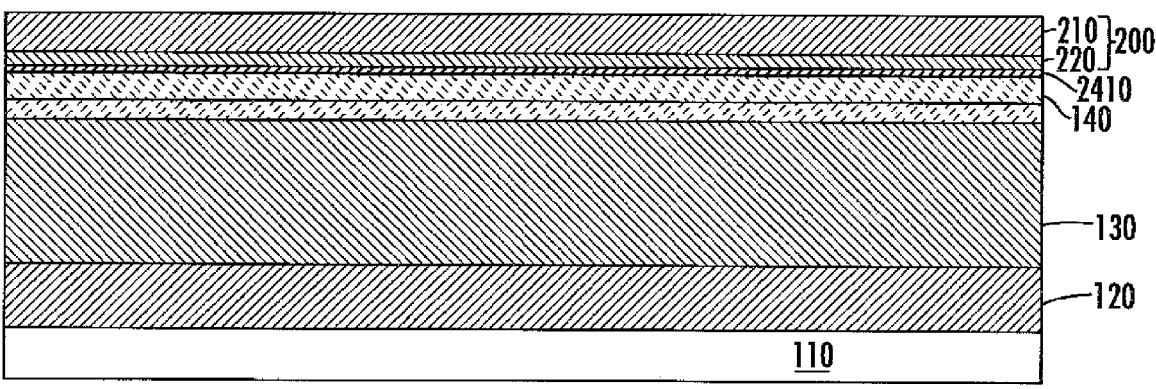

In another embodiment shown in FIGS. 35-41, AlN is used as a thin cap layer over the AlGaN layer. FIG. 35 shows a similar structure as that of FIG. 24, but the AlN layer 2410 is in the range of about 5 Å to about 100 Å, preferably about 10 Å to about 20 Å.

Figure 37:
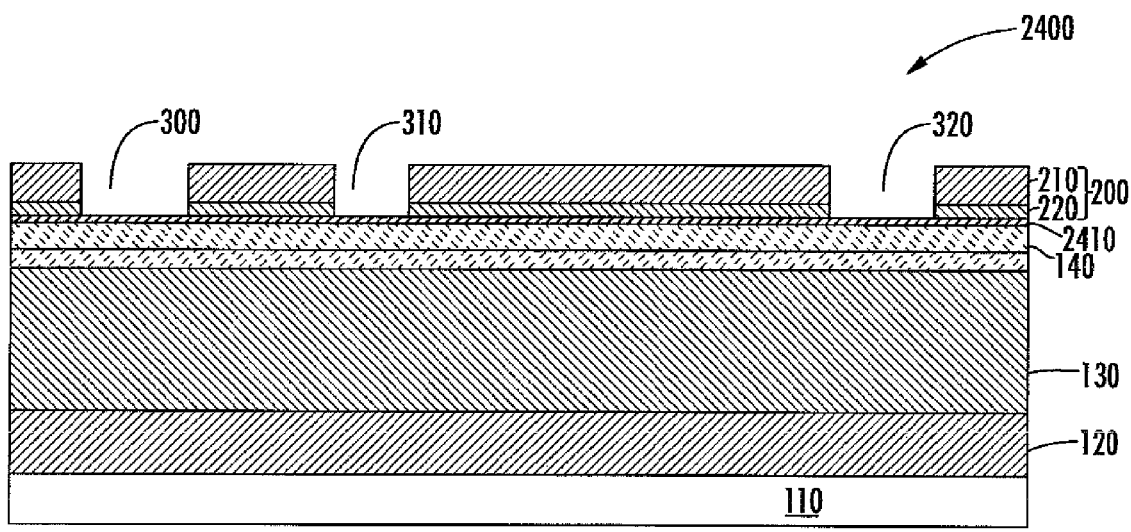

In the embodiment shown, a dielectric stack 200 can then be deposited using known oxide and nitride deposition techniques. The dielectric stack 200 can include one or more dielectric layers, for example, a first dielectric layer 220 including, e.g., nitride, oxide, oxynitride, etc., and a second dielectric layer 210 including an undensified oxide. The dielectric stack 200 can be blanket deposited over the AlGaN layer 140. The dielectric stack 200 can be patterned by, for example, a contact mask (not shown), that can be used to define a source contact area 300, a gate contact area 310, and a drain contact area 320. An advantage to this process is that a single masking step is used to self-align the gate contact area to the source contact area 300 and the drain contact area 320. By using a single masking step, precise control of the gate-source and gate-drain spacing can be obtained. The resulting structure is shown in FIG. 37, in which the three defined areas (300, 310, 320) can be etched to remove the dielectric stack 200 to expose a surface of the AlN layer 2410.

Figure 38:
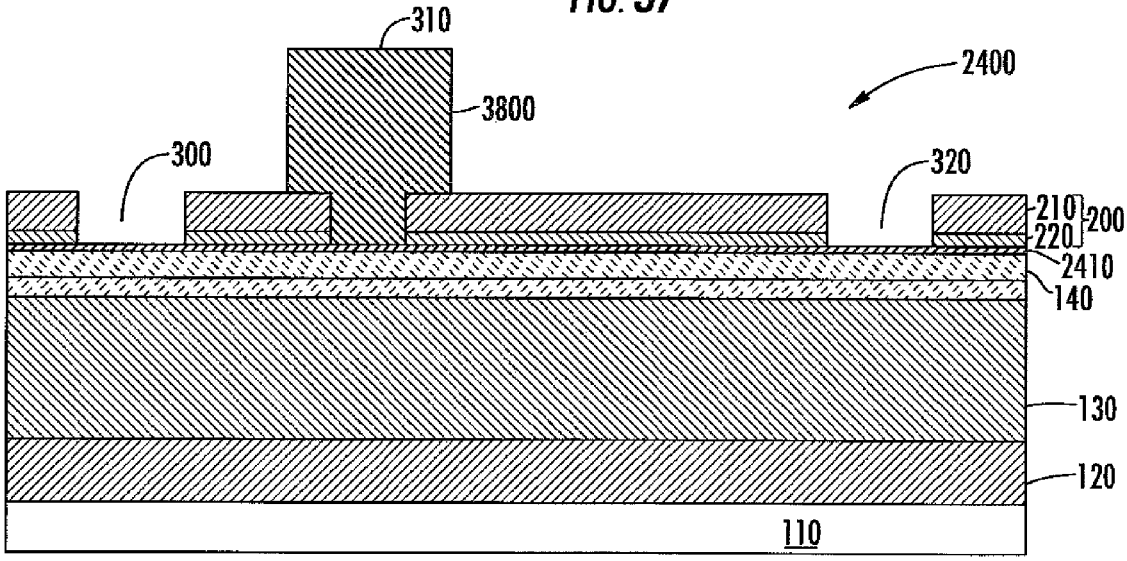
Figure 39:
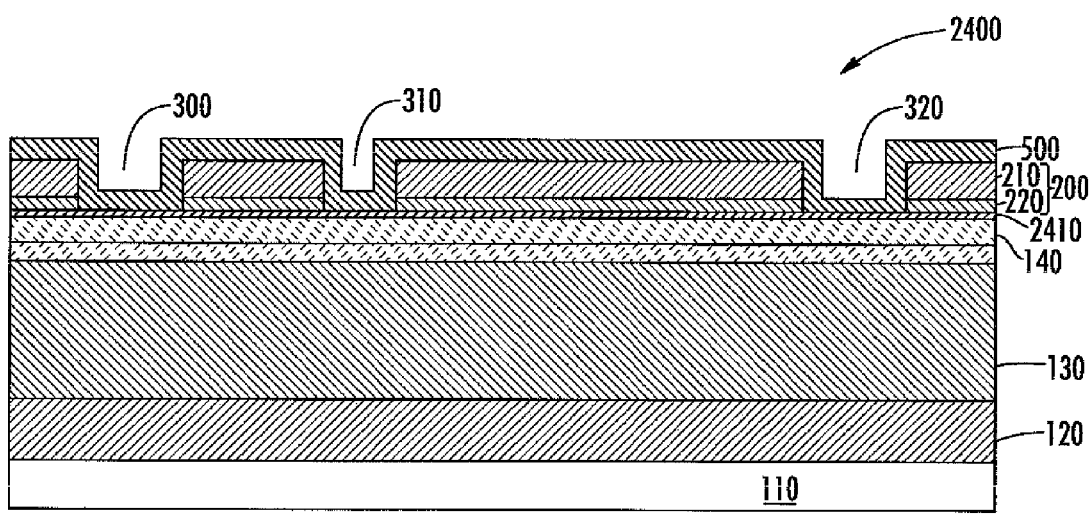
Figure 40:
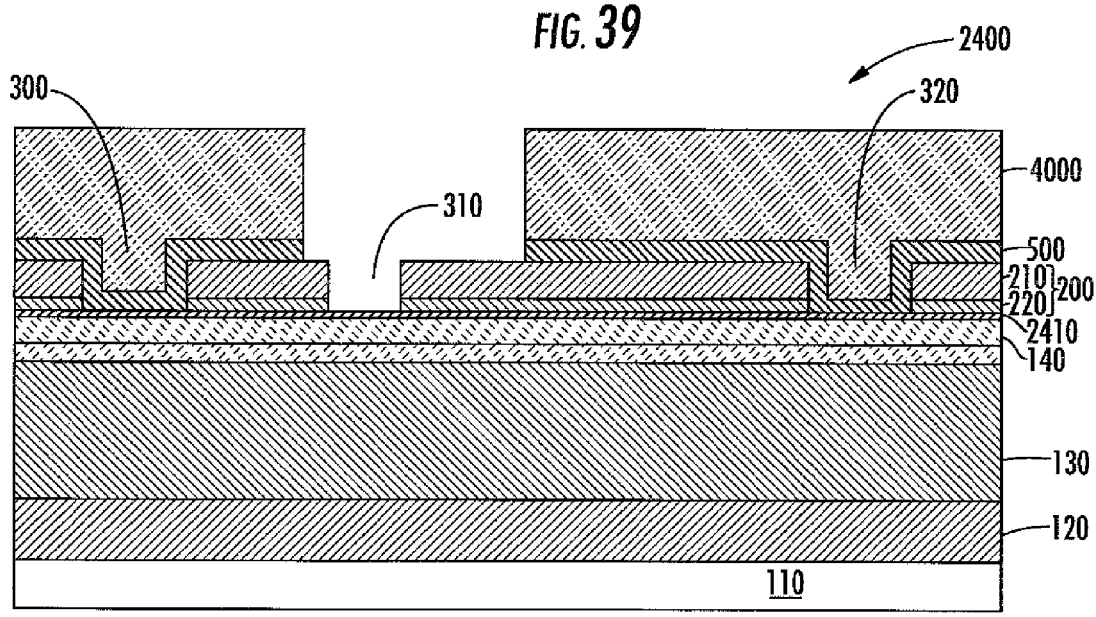
Figure 41:
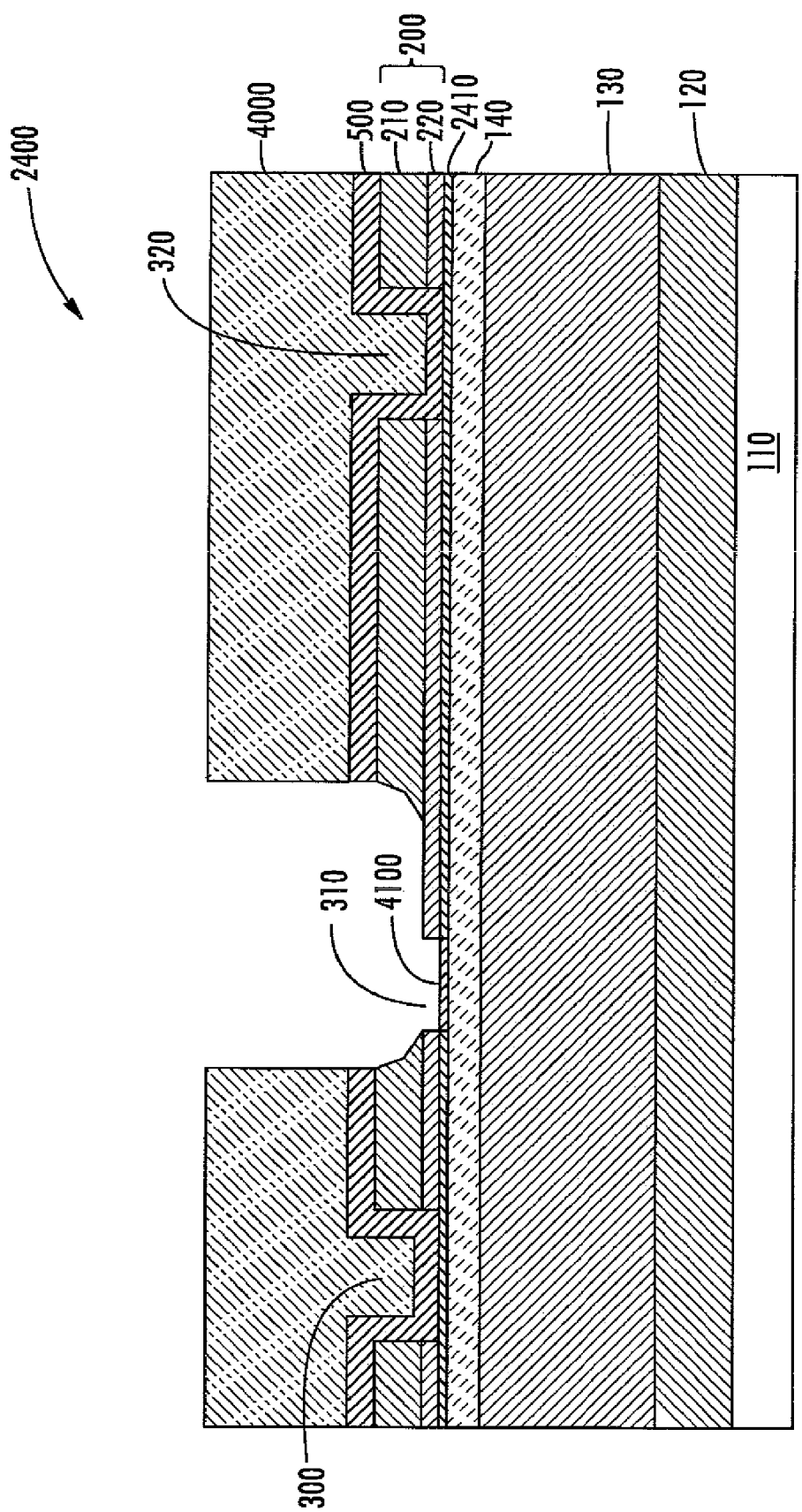

FIG. 38 shows an optional gate protection mask 3800. An optional N+ implant 400 can be performed using the gate protection mask 3800. A resist strip can be performed to remove the gate protection mask 3800 and an anneal at about 1100° C. to about 1300° C. in nitrogen ambient can be performed to further drive in the N+ implant. In FIG. 39, a dielectric layer 500 (e.g., plasma silicon nitride) can be deposited conformally over the patterned dielectric stack 200 and the exposed portions of the AlN layer 2410. The dielectric layer 500 can be deposited using LPCVD. As shown in FIG. 40, a mask 4000 can be formed to expose the defined gate contact area 310. A first dry etch can be used to selectively etch the dielectric layer 500 in the defined gate contact area 310. The first dry etch can be selective to AlN and dielectric stack 200. Following the first dry etch, a second etch that is selective to the dielectric layer 220 and the dielectric layer 500 can be performed (no under-cut of the dielectric layer 500 is shown in this embodiment). The second etch can also thin the thin AlN layer 2410. The resulting structure is shown in FIG. 41, which shows the gate contact area 310 including an exposed portion of the thinned AlN layer 2410 having approximately straight sidewalls formed from the dielectric layer 220 and an approximately wider bowl shaped area formed in the dielectric layer 210, with no under-cutting under the dielectric layer 500.

Following resist strip (not shown), the thinned AlN layer 2410 can be oxidized to create an $Al_2O_3$ insulator 4100 in the exposed gate contact area. The oxidation can be performed by rapid temperature anneal (RTA), other thermal processes, and/or by plasma enhanced processes. While no specific theory has been proven, it is believed that the formation of the $Al_2O_3$ insulator 4100 enhances adhesion between the metallization and the AlGaN layer 140.

It will be evident to one of ordinary skill in the art that the processes and resulting structures previously described can be modified to form various semiconductor device features having different patterns, widths, and/or materials using a single mask step. Exemplary methods and resulting structures are described below.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. In addition, while a particular feature of the present disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B or A and/or B, means A alone, B alone, or A and B. The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the methods and structures disclosed herein. It is intended that the specification and examples be considered as exemplary only, with a true scope and spirit of the present teachings being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:

1. A method of manufacturing an enhancement mode (e-mode) high electron mobility transistor (HEMT), comprising:
    forming a first compound semiconductor layer over a surface of a substrate;
    forming a second compound semiconductor layer over a surface of the first compound semiconductor layer opposite the substrate surface;
    forming a first dielectric over a surface of the second compound semiconductor layer opposite the surface of the first compound semiconductor;
    defining a source contact area, a drain contact area, and a gate contact area, through the first dielectric using one mask layer to expose portions of the second compound semiconductor layer;
    forming a second dielectric conformally over the first dielectric and the exposed portions of the second compound semiconductor layer;
    etching the second dielectric to expose the gate area;
    isotropically etching the first dielectric exposed in the gate contact area to form an etched area;
    growing epitaxial p-type second compound semiconductor on the exposed gate contact area to substantially fill the etched gate contact area and to cover at least a portion of the etched area of the first dielectric.

2. The method of claim 1, further comprising:
    masking the second dielectric to define the gate contact area.

3. The method of claim 2, wherein masking further defines a field plate area.

4. The method of claim 1, wherein etching the second dielectric further defines a lateral extension of an integrated field plate area.

5. The method of claim 1, further comprising:
    growing the epitaxial p-type second compound semiconductor to substantially fill the etched first dielectric area and to cover at least a portion of the second dielectric.

6. The method of claim 1, further comprising:
    forming an ohmic source contact over the source contact area;
    forming an ohmic drain contact over the drain contact area; and
    forming a Schottky metal over at least a portion of the epitaxial p-type second compound semiconductor.

7. The method of claim 6, wherein the formed ohmic source contact further forms a field plate.

8. The method of claim 6, wherein the formed Schottky metal further forms a field plate.

9. The method of claim 1, wherein etching the second dielectric to expose the gate contact area further comprises:
    recess etching at least a portion of the gate contact area through at least a portion of the second compound semiconductor layer.

10. The method of claim 1, wherein the first compound semiconductor comprises GaN.

11. The method of claim 1, wherein the substrate is selected from silicon, sapphire, silicon carbide, indium phosphide, diamond, silicon on diamond, and sapphire on diamond.

12. The method of claim 1, further comprising:
forming an AlGaN layer between the surface of the substrate and the first compound semiconductor layer.

13. The method of claim 1, wherein the second compound semiconductor layer comprises at least one of AlGaN, GaN, InP, and InAlN.

14. The method of claim 1, wherein forming the second compound semiconductor layer, further comprises:
forming a compound semiconductor stack comprising at least two different compound semiconductors layers.

15. The method of claim 14, wherein the semiconductor stack comprises an AlGaN layer and an AlN layer.

16. The method of claim 1, wherein the first dielectric comprises a stack of dielectric layers.

17. The method of claim 1, wherein forming the second dielectric further includes:
forming a plasma nitride as the second dielectric layer.

18. The method of claim 1, further comprising:
forming a cap layer between the first dielectric layer and the second compound semiconductor layer, wherein the cap layer comprises a GaN layer.

19. The method of claim 1, wherein forming the first dielectric further comprises:
forming multiple dielectric layers.

20. The method of claim 18, further comprising:
forming an AlGaN layer between the substrate and the first compound layer.

21. A method of manufacturing an enhancement mode (e-mode) high electron mobility transistor (HEMT), comprising:
forming a GaN layer over a surface of a substrate;
forming a III-V semiconductor layer over a surface of the GaN layer opposite the substrate surface;
forming an AlN semiconductor layer between the III-V semiconductor layer and a first dielectric;
forming the first dielectric over a surface of the AlN semiconductor layer opposite the surface of the III-V semiconductor layer;
defining a source contact area, a drain contact area, and a gate contact area, through the first dielectric using one mask layer to expose the AlN semiconductor layer;
forming a second dielectric conformally over the first dielectric and the exposed portions of the AlN semiconductor layer;
etching the second dielectric to expose the AlN in the defined gate contact area; and
growing epitaxial p-type III-V semiconductor over the exposed gate contact area to substantially fill the etched gate contact area and to cover at least a portion of the etched first dielectric area.

22. The method of claim 21, further comprising:
oxidizing the exposed AlN in the defined gate contact area to form a thin aluminum oxide layer; and
growing epitaxial p-type III-V semiconductor on the thin aluminum oxide layer in the defined gate contact area to substantially fill the defined gate area.

23. The method of claim 22, wherein oxidizing the exposed AlN further comprises:
forming a thin oxidation layer of about 5 Å to about 120 Å.

24. The method of claim 22, wherein the thin oxidation layer is about 10 Å to about 20 Å.

25. The method of claim 21, wherein oxidizing the exposed AlN further comprises:
applying an oxidizing process selected from the group consisting of thermal oxidation, rapid thermal anneal, and plasma enhanced oxidation.

26. The method of claim 21, further comprising:
growing the epitaxial p-type III-V semiconductor through at least a portion of the second dielectric.

27. The method of claim 21, further comprising:
masking the second dielectric to define the gate contact area.

28. The method of claim 27, wherein masking further defines a field plate area.

29. The method of claim 21, wherein etching the second dielectric further defines a lateral extension of an integrated field plate area.

30. The method of claim 21, further comprising:
growing the epitaxial p-type III-V semiconductor to substantially fill the etched first dielectric area and to cover at least a portion of the second dielectric.

31. The method of claim 21, further comprising:
forming an ohmic source contact over the source contact area;
forming an ohmic drain contact over the drain contact area; and
forming a Schottky metal over at least a portion of the epitaxial p-type III-V semiconductor.

32. The method of claim 31, wherein the formed ohmic source contact further forms a field plate.

33. The method of claim 31, wherein the formed Schottky metal further forms a field plate.

34. The method of claim 21, wherein etching the second dielectric to expose the gate contact area further comprises:
recess etching at least a portion of the gate contact area through at least a portion of the III-V semiconductor layer.

35. The method of claim 21, wherein the substrate is selected from silicon, sapphire, silicon carbide, diamond, silicon on diamond, and sapphire on diamond.

36. The method of claim 21, further comprising:
forming an AlGaN layer between the surface of the substrate and the GaN layer.

37. The method of claim 21, wherein the III-V semiconductor layer comprises at least one of AlGaN, GaN, and InAlN.

38. The method of claim 21, wherein the first dielectric comprises a stack of dielectric layers.

39. The method of claim 21, wherein forming the second dielectric further includes:
forming a plasma nitride as the second dielectric layer.

40. The method of claim 21, further comprising:
forming a cap layer between the first dielectric layer and the III-V semiconductor layer, wherein the cap layer comprises a GaN layer.

41. The method of claim 40, further comprising:
forming an AlGaN layer between the substrate and the GaN layer.

42. The method of claim 21, wherein forming the first dielectric further comprises:
forming multiple dielectric layers.

43. A method of manufacturing an enhancement mode (e-mode) high electron mobility transistor (HEMT), comprising:
forming a first compound semiconductor layer over a surface of a substrate;
forming a second compound semiconductor layer over a surface of the first compound semiconductor layer opposite the substrate surface;
forming a third compound semiconductor layer between the second compound semiconductor layer and a first dielectric;

forming the first dielectric over a surface of the third compound semiconductor layer opposite the surface of the second semiconductor layer;

defining a source contact area, a drain contact area, and a gate contact area, through the first dielectric using one mask layer to expose the AlN semiconductor layer;

forming a second dielectric conformally over the first dielectric and the exposed portions of the third compound semiconductor layer;

etching the second dielectric and a portion of the first dielectric to expose the third compound semiconductor in the defined gate contact area; and growing epitaxial p-type second compound semiconductor over the exposed gate contact area to substantially fill the etched gate contact area and to cover at least a portion of the etched first dielectric area.

44. A method of manufacturing an enhancement mode (e-mode) high electron mobility transistor (HEMT), comprising:

forming a GaN layer over a surface of a substrate;

forming a III-V semiconductor layer over a surface of the GaN layer opposite the substrate surface;

forming an AlN semiconductor layer between the III-V semiconductor layer and a first dielectric;

forming the first dielectric over a surface of the AlN semiconductor layer opposite the surface of the III-V semiconductor layer;

defining a source contact area, a drain contact area, and a gate contact area, through the first dielectric using one mask layer to expose the AlN semiconductor layer;

forming a second dielectric conformally over the first dielectric and the exposed portions of the AlN semiconductor layer;

etching the second dielectric and a portion of the first dielectric to expose the AlN in the defined gate contact area; and growing epitaxial p-type III-V semiconductor over the exposed gate contact area to substantially fill the etched gate contact area and to cover at least a portion of the etched first dielectric area.

* * * * *

UNITED STATES PATENT AND TRADEMARK OFFICE
CERTIFICATE OF CORRECTION

| | | |
|---|---|---|
| PATENT NO. | : 8,168,486 B2 | Page 1 of 1 |
| APPLICATION NO. | : 12/823060 | |
| DATED | : May 1, 2012 | |
| INVENTOR(S) | : Hebert | |

It is certified that error appears in the above-identified patent and that said Letters Patent is hereby corrected as shown below:

Title page, Item (60), replace "provisional application No. 61/289,553, filed on Nov. 23, 2009." with --provisional application No. 61/289,553, filed on Dec. 23, 2009.--

Signed and Sealed this
Fourth Day of December, 2012

David J. Kappos
*Director of the United States Patent and Trademark Office*